(12) United States Patent
Ware et al.

(10) Patent No.: US 8,943,224 B2
(45) Date of Patent: Jan. 27, 2015

(54) CHIP SELECTION IN A SYMMETRIC INTERCONNECTION TOPOLOGY

(75) Inventors: Frederick A. Ware, Los Altos Hills, CA (US); Brian S. Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/514,977

(22) PCT Filed: Dec. 7, 2010

(86) PCT No.: PCT/US2010/059288
§ 371 (c)(1),
(2), (4) Date: Jun. 9, 2012

(87) PCT Pub. No.: WO2011/115648
PCT Pub. Date: Sep. 22, 2011

(65) Prior Publication Data
US 2012/0254472 A1    Oct. 4, 2012

Related U.S. Application Data

(60) Provisional application No. 61/314,147, filed on Mar. 15, 2010.

(51) Int. Cl.
*G06F 3/00*    (2006.01)
*G06F 13/16*    (2006.01)
*G11C 5/02*    (2006.01)

(52) U.S. Cl.
CPC .............. *G06F 13/1684* (2013.01); *G11C 5/02* (2013.01)
USPC ............................................................ 710/3

(58) Field of Classification Search
None
See application file for complete search history.

(56) References Cited

U.S. PATENT DOCUMENTS

| 5,848,258 | A | 12/1998 | Fenwick et al. | 395/405 |
|---|---|---|---|---|
| 5,860,080 | A * | 1/1999 | James et al. | 711/4 |
| 6,657,914 | B1 | 12/2003 | Ong et al. | 325/230.06 |
| 6,842,393 | B2 * | 1/2005 | Ryan et al. | 365/230.03 |
| 7,027,349 | B2 * | 4/2006 | Ryan et al. | 365/230.03 |
| 7,111,149 | B2 | 9/2006 | Eilert | 711/220 |
| 7,327,592 | B2 | 2/2008 | Silvestri | 365/63 |

(Continued)

OTHER PUBLICATIONS

Talebbeydokhti, Nema et al., "Constant Transconductance Bias Circuit with an On-Chip Resistor", 2006 IEEE International Symposium on Circuits and Systems, Proceedings, May 21-24, 2006, pp. 2857-2860. 4 pages.

(Continued)

*Primary Examiner* — Elias Mamo
(74) *Attorney, Agent, or Firm* — Charles Shemwell

(57) ABSTRACT

Techniques for distinguishing between symmetrically-connected integrated circuit devices so that each device may be individually selected are disclosed in reference to various embodiments. In one embodiment, a bi-directional data path provided for ongoing data transfer between a master device and multiple nominally identical slave devices is used to receive a merged set of randomly generated values from the slave devices, and then used to return one or more device-select values that enable assignment of a unique chip-identifier (ID) within each slave device. After chip-IDs have been assigned to the slave devices, the master device may issue one or more chip-select signals corresponding to the unique chip ID assigned to a given slave and thereby enable that slave device, exclusively of the others, to participate in a data transfer operation over the bi-directional data path.

17 Claims, 21 Drawing Sheets

(56) References Cited

U.S. PATENT DOCUMENTS

| | | | | |
|---|---|---|---|---|
| 7,346,051 | B2 | 3/2008 | Nakayama et al. | 370/386 |
| 7,649,795 | B2 * | 1/2010 | Kim et al. | 365/219 |
| 2004/0257847 | A1 | 12/2004 | Matsui et al. | 365/63 |
| 2005/0082664 | A1 | 4/2005 | Funaba et al. | 257/724 |
| 2005/0083753 | A1 * | 4/2005 | Ryan et al. | 365/222 |
| 2006/0044917 | A1 | 3/2006 | Kawakami et al. | 365/226 |
| 2006/0050580 | A1 | 3/2006 | Yamaguchi et al. | 365/201 |
| 2006/0129767 | A1 * | 6/2006 | Berenyi et al. | 711/154 |
| 2007/0126105 | A1 | 6/2007 | Yamada et al. | 257/686 |
| 2007/0280013 | A1 * | 12/2007 | Sakuragi | 365/200 |
| 2008/0106757 | A1 * | 5/2008 | Asauchi | 358/1.15 |
| 2008/0137439 | A1 | 6/2008 | Janzen et al. | 365/189.02 |
| 2009/0039915 | A1 | 2/2009 | Ruckerbauer | 326/38 |
| 2009/0103387 | A1 * | 4/2009 | Shau | 365/230.02 |
| 2009/0198857 | A1 | 8/2009 | Pyeon | 710/307 |

OTHER PUBLICATIONS

International Search Report with mail date of Apr. 5, 2011 and the Written Opinion re Int'l Application No. PCT/US2010/059288. 11 Pages.

* cited by examiner

FIG. 13C

| Case | CSmask[1] | CSmask[0] |
|---|---|---|
| 2V (P,Q = 0,0) | X[4:0] • EcsM[4:0] | Y[4:0] • EcsM[4:0] |
| 1V2U (P,Q = 0,1) | X[4:0] • EcsM[4:0] | (Y[4:0] • EcsM[4:0]) + (Z[4:0] • EcsM[4:0]) |
| 3U (P,Q = 1,1) | (X[4:0] • EcsM[4:0]) + (Z[4:0] • EcsM[4:0]) | (Y[4:0] • EcsM[4:0]) + (Z[4:0] • EcsM[4:0]) |

FIG. 19B

```
100 AssignChipID
110   chipID=0;                                              // initialize chip ID
120   QueryMem(0, 1)                                         // search mem with query ID = 0, recursion level = 1
130 END 200 QueryMem(Qid, R)
210   Qmsk = rightshift (2^M-1, R)                           // right-shift of 11..11b by R bit positions to generate query mask
220   Bmsk = rightshift (2^M/2, R-1)                         // right-shift of 100..00b by R-1 to yield mask with one-hot in "level R" bit (i.e., bit 2^M - R)
230   do                                                     // begin loop
240     Load Qid, Qmsk in all mem                            // output Qid and Qmsk, and broadcast load commands
250     capture Qresult                                      // issue EH/EL, broadcast EH/EL
260     if Qresult == hit, then
270       if R < 2^M, then                                   // max recursion level reached?
280         QueryMem (Qid, R+1)                              // no, recurse to search next bit position
290       else
300         Load chipID in mem                               // max level reached, broadcast chip-ID-load command
310         increment chipID                                 // change ID in prep for next chip ID assignment
320       endif
330     endif
340     Qid = Qid xor Bmask                                  // invert level R bit in Query ID
350   while ((Qid & Bmask) > 0) and (chipID < 2^N)           // exit if both states of level R bit OR past max chipID
360   Return
```

FIG. 19C

Search example in system having two memories with 5-bit signatures, 11001 and 10010

| Q-Loop# | Qid | R | Qmsk | Action | Qresult | State Change |
|---|---|---|---|---|---|---|
| 001 | 00000 | 1 | 01111 | Query 0xxxx | Miss | Qid → 10000 |
| 002 | 10000 | 1 | 01111 | Query 1xxxx | Hit | R → 2 (recurse) |
| 003 | 10000 | 2 | 00111 | Query 10xxx | Hit | R → 3 (recurse) |
| 004 | 10000 | 3 | 00011 | Query 100xx | Hit | R → 4 (recurse) |
| 005 | 10000 | 4 | 00001 | Query 1000x | Miss | Qid → 10010 |
| 006 | 10010 | 4 | 00001 | Query 1001x | Hit | R → 5 (recurse) |
| 007 | 10010 | 5 | 00000 | Query 10010 | Hit | assign ChipID 0; Qid → 10011 |
| 008 | 10011 | 5 | 00000 | Query 10011 | Miss | Qid → 10010, R → 4 (return from recursion) |
| 006' | 10010 | 4 | 00001 | No query | — | Qid → 10000, R → 3 (return from recursion) |
| 004' | 10000 | 3 | 00011 | No query | — | Qid → 10100 (completing iteration 004) |
| 009 | 10100 | 3 | 00011 | Query 101xx | Miss | Qid → 10000, R → 2 (return from recursion) |
| 003' | 10000 | 2 | 00111 | No query | — | Qid → 11000 (completing iteration 003) |
| 010 | 11000 | 2 | 00111 | Query 11xxx | Hit | R → 3 (recurse) |
| 011 | 11000 | 3 | 00011 | Query 110xx | Hit | R → 4 (recurse) |
| 012 | 11000 | 4 | 00001 | Query 1100x | Hit | R → 5 (recurse) |
| 013 | 11000 | 5 | 00000 | Query 11000 | Miss | Qid → 11001 |
| 014 | 11001 | 5 | 00000 | Query 11001 | Hit | assign ChipID 1; Qid → 11000 |

CHIP SELECTION IN A SYMMETRIC INTERCONNECTION TOPOLOGY

CROSS REFERENCE TO RELATED APPLICATIONS

Pursuant to 35 U.S.C. §§365 and 371, this application is a United States National Stage Application that claims priority to International Application No. PCT/US2010/059288 filed Dec. 7, 2010, which claims priority to U.S. Provisional Patent Application No. 61/314,147 filed Mar. 15, 2010. Each of the above-identified patent applications is hereby incorporated by reference in its entirety.

TECHNICAL FIELD

The present invention relates generally to the field of electronic communications and more particularly to communications between integrated circuit devices.

BRIEF DESCRIPTION OF THE DRAWINGS

The present invention is illustrated by way of example, and not by way of limitation, in the figures of the accompanying drawings and in which like reference numerals refer to similar elements and in which.

Figure 11:
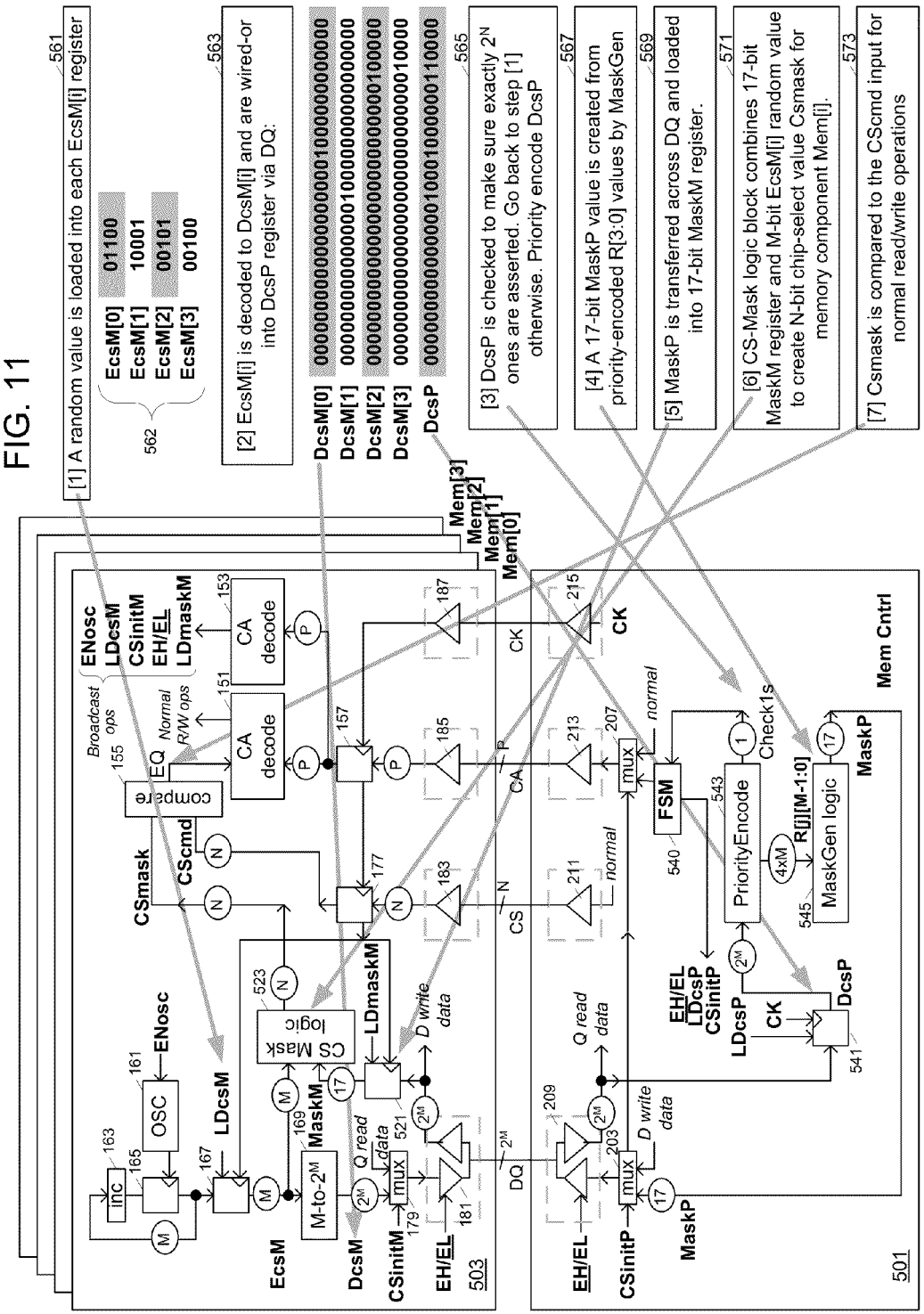
FIG. 11 illustrates an exemplary approach for determining and assigning unique chip IDs in an alternative embodiment of a system of five symmetrically coupled ICs, including a memory controller and four memory devices.

13A-13C illustrate an embodiment and operation of a mask generation circuit that may be used to implement the mask generation logic within the memory controller of FIG. 11.

Figure 13A:
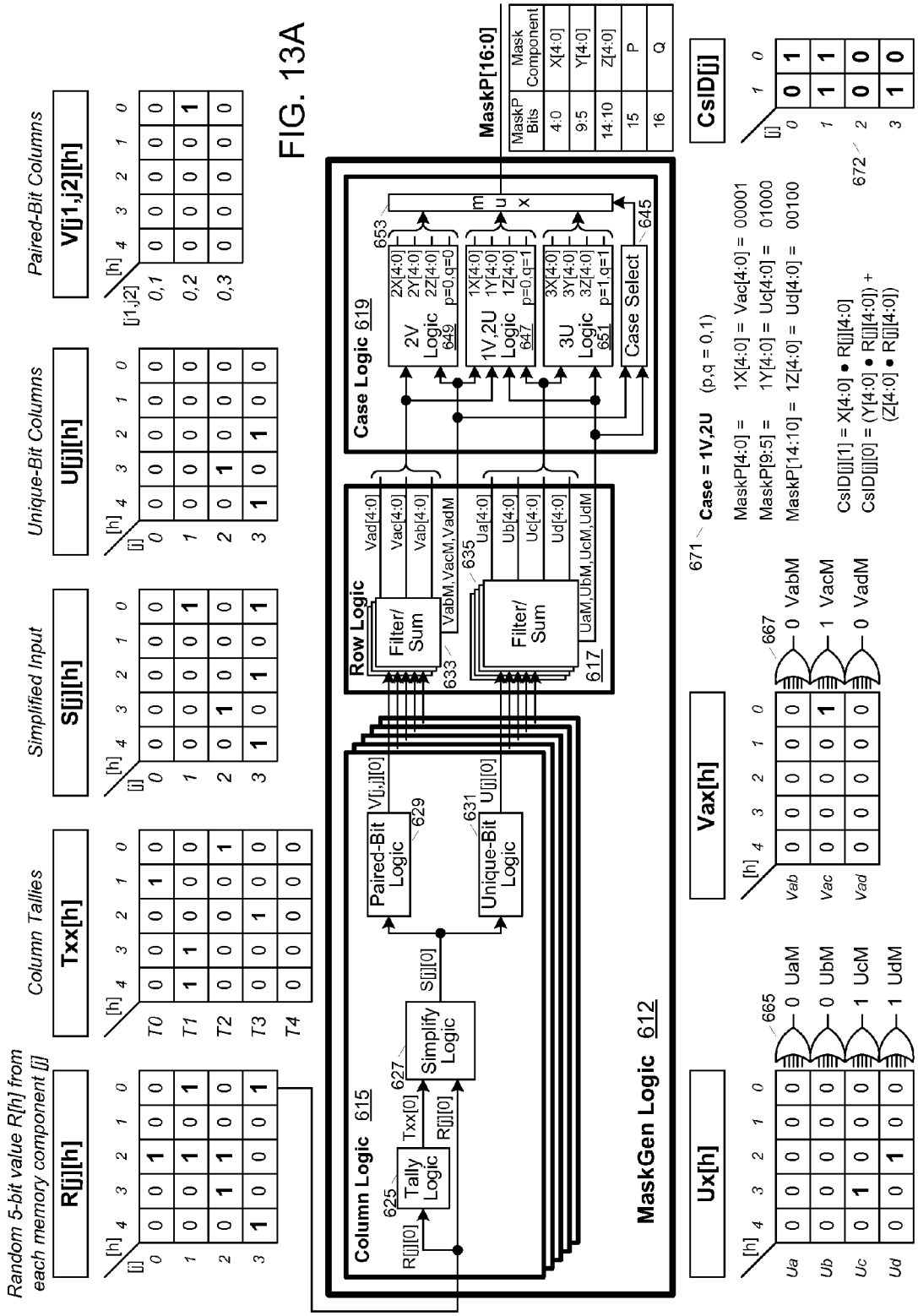
Figure 13B:
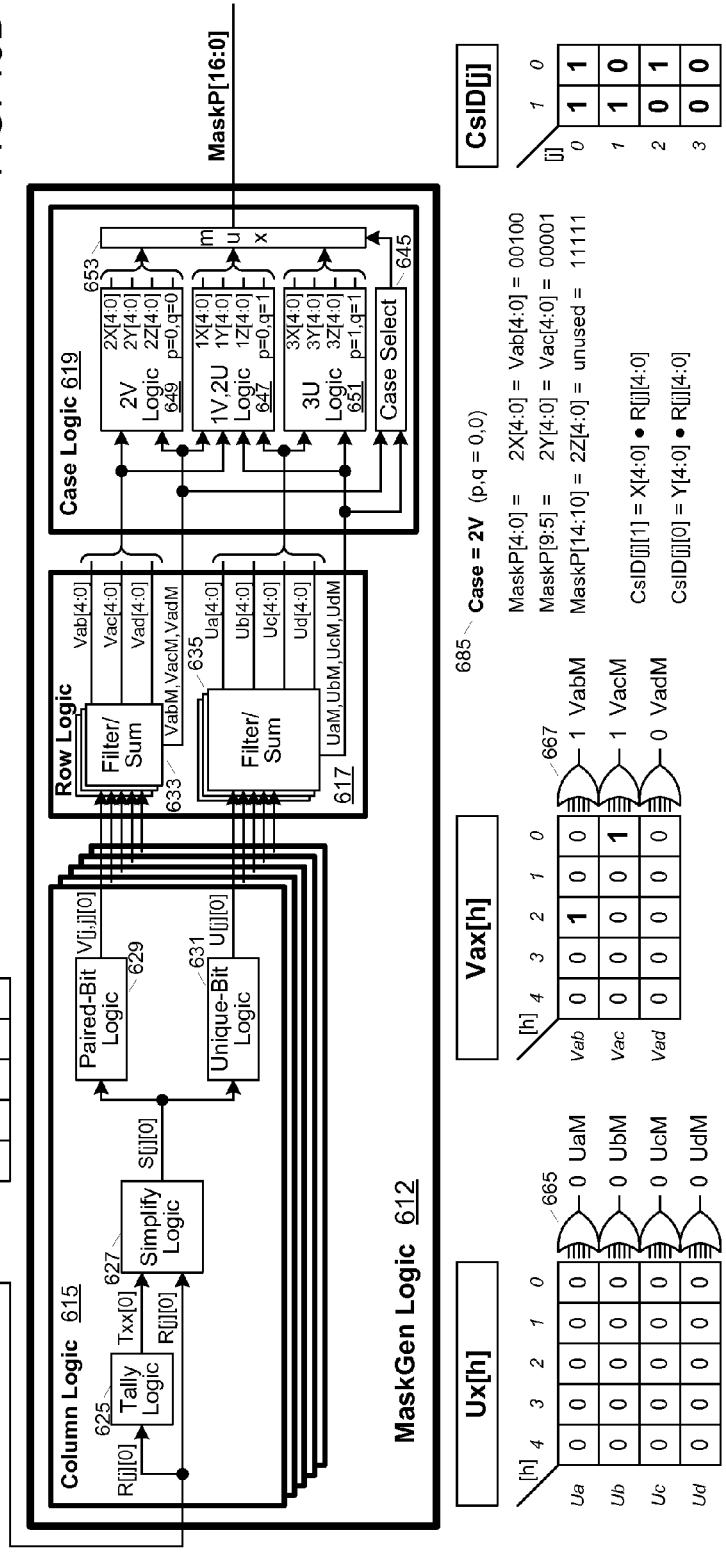
Figure 13C:
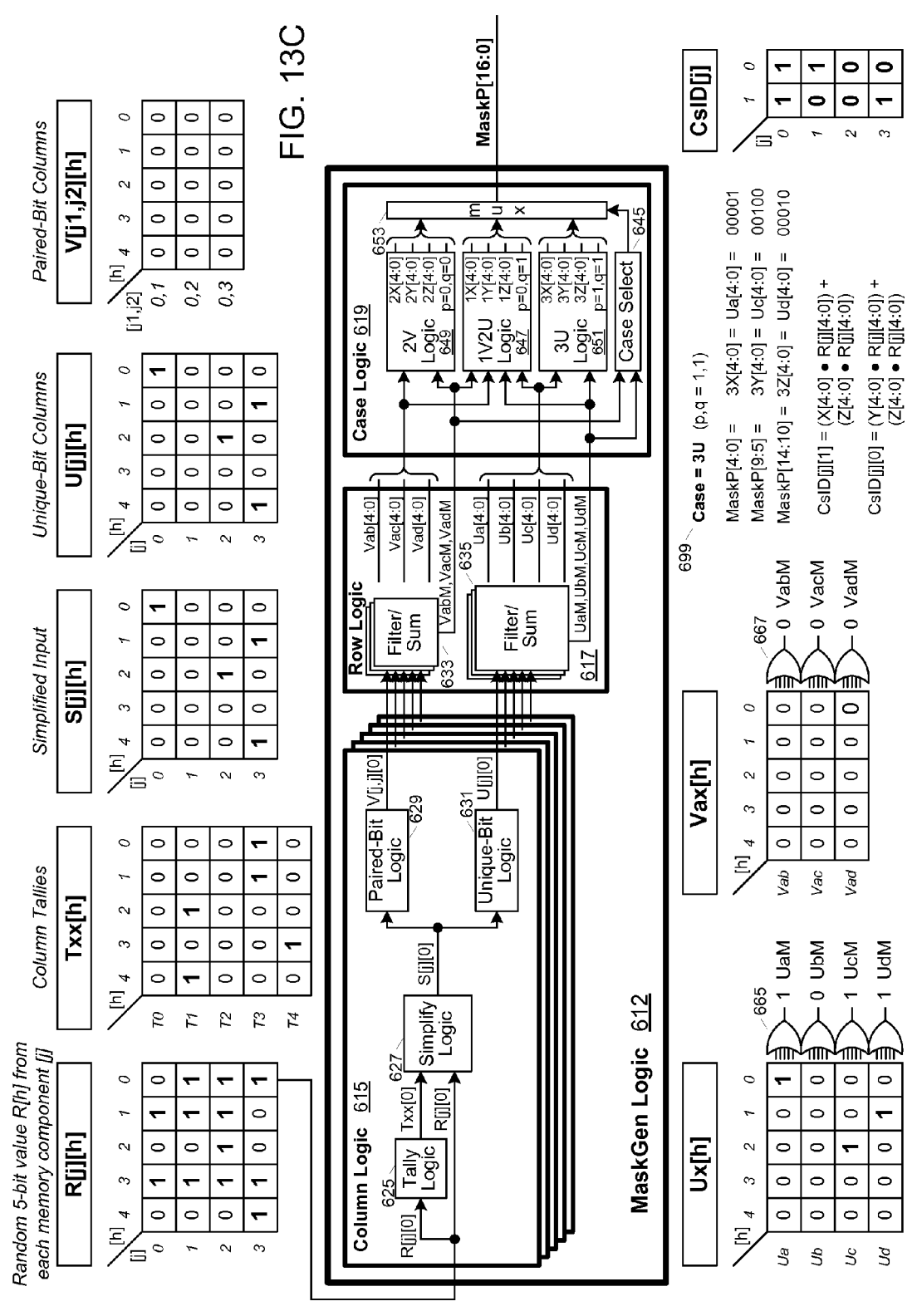
Figure 14:
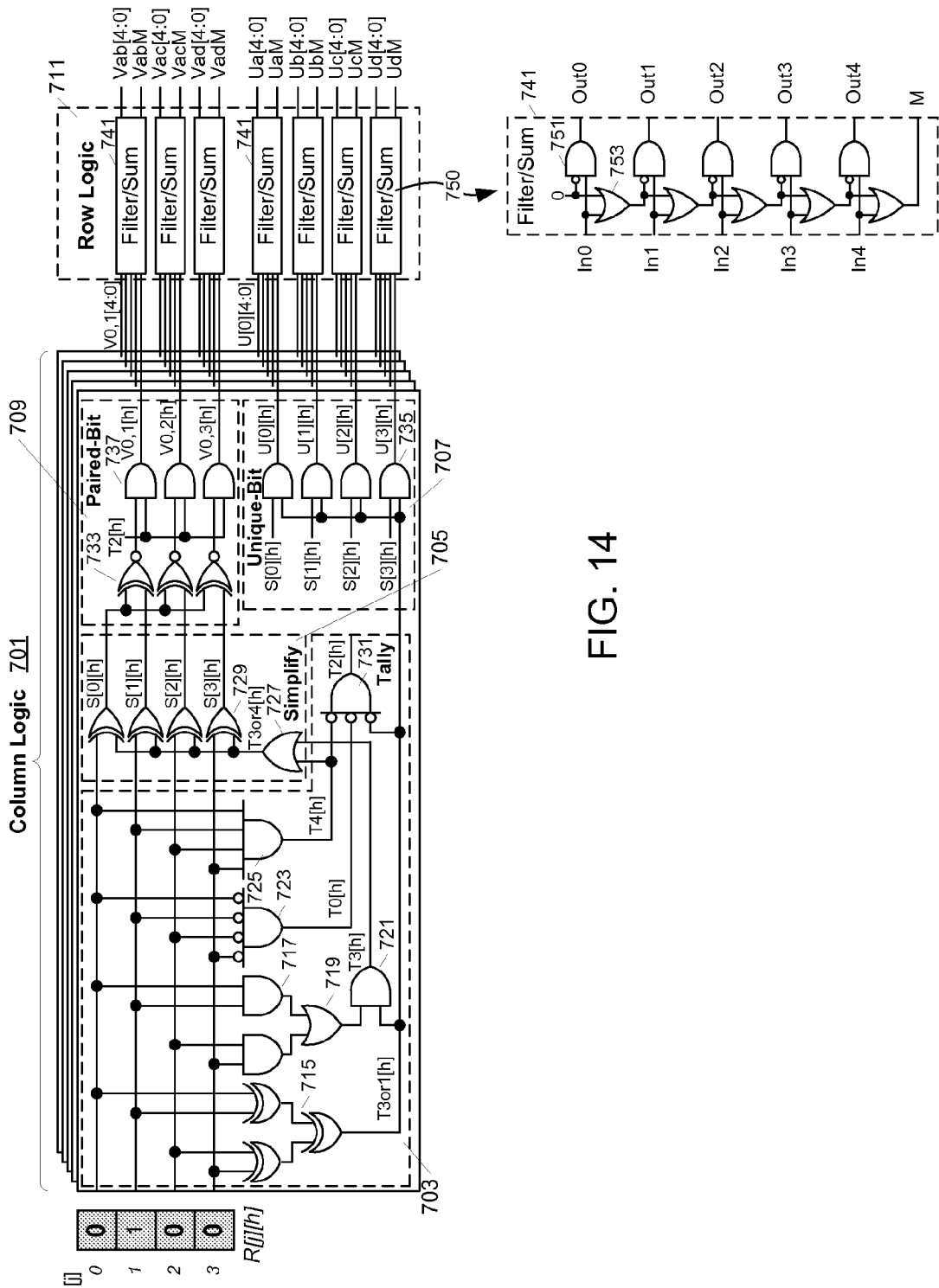

FIG. 14 illustrates embodiments of the column logic circuits and row logic circuit that may be used to implement the column logic circuits and row logic circuit, respectively, within the mask generation circuit of FIGS. 13A-13C.

Figure 15:
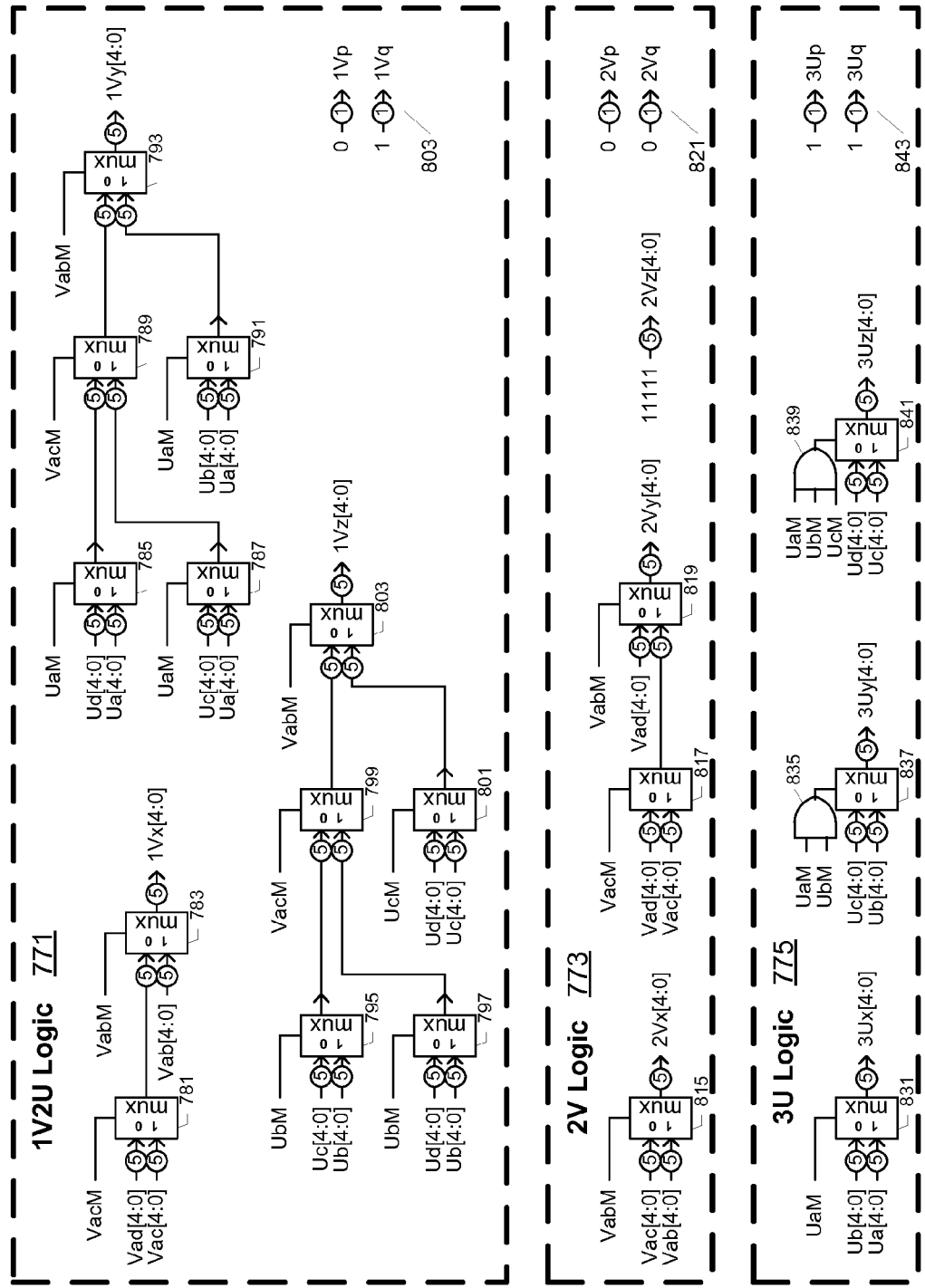

FIG. 15 illustrates embodiments of row-selector logic circuits that may be used to implement the 1V2U, 2V and 3U row-selector circuits within the mask generation circuit of FIGS. 13A-13C.

Figure 16:
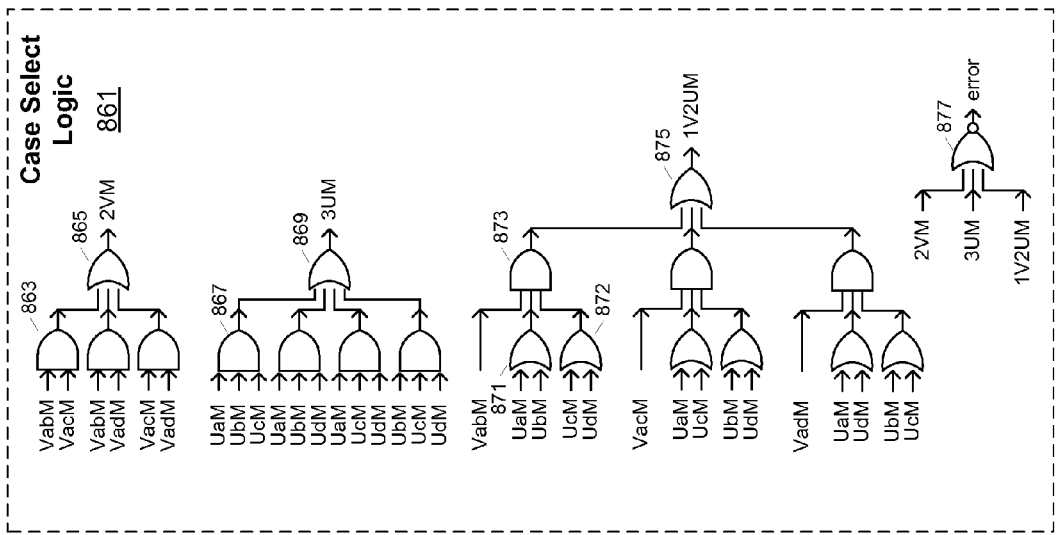

FIG. 16 illustrates an embodiment of a case select logic circuit that may be used to implement the case select logic circuit within the mask generation circuit of FIGS. 13A-13C.

Figure 17:
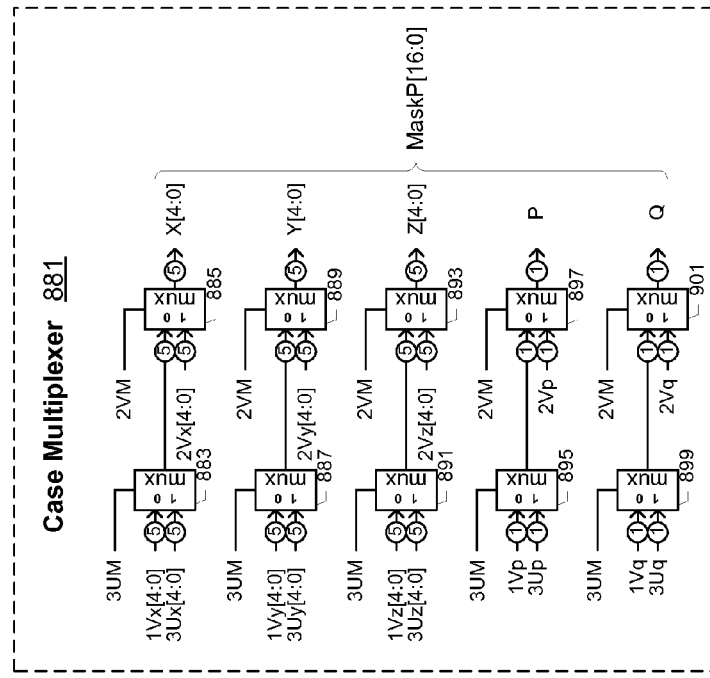

FIG. 17 illustrates an embodiment of a case multiplexer that may be used to implement the case multiplexer within the mask generation circuit of FIGS. 13A-13C.

Figures 18A, 18B:
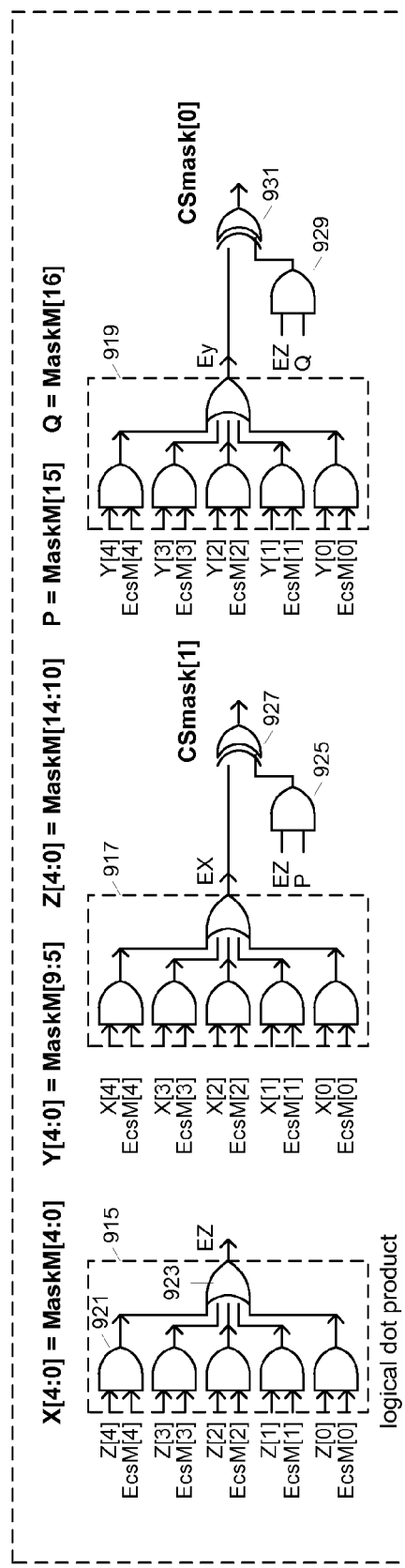

FIGS. 18A and 18B illustrate embodiments of a mask circuit and corresponding logical operations that may be employed within each memory device in the system of FIG. 11 to generate a unique chip-select mask value (i.e., chip identifier).

Figure 19A:
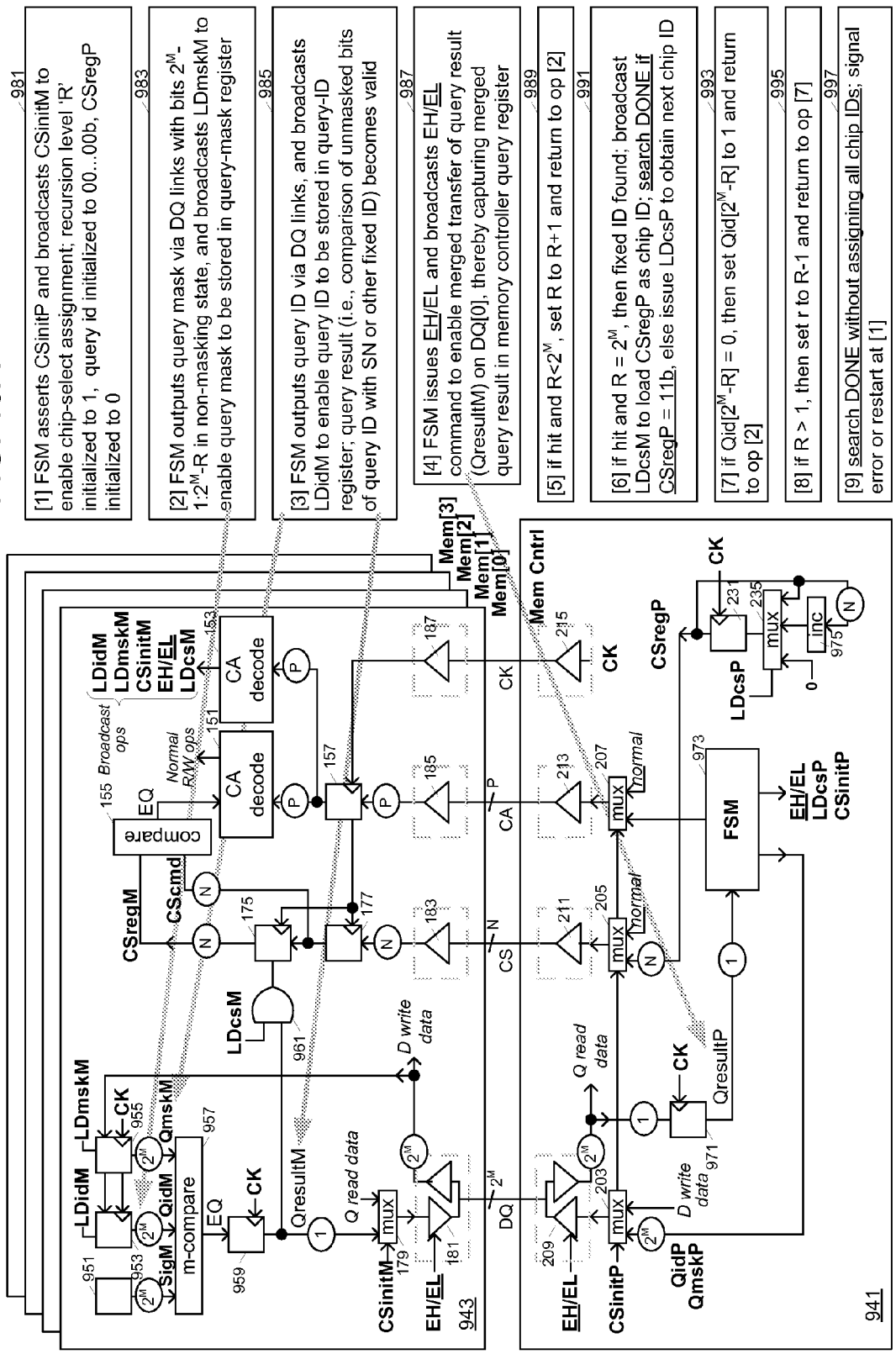

FIG. 19A illustrates an exemplary approach for determining and assigning unique chip IDs in an another alternative embodiment of a system of five symmetrically coupled ICs, including a memory controller and four memory devices.

FIG. 19B is a pseudo-code listing of exemplary operations that may be executed to effect the recursive identifier-search operation described in reference to FIG. 19A and which may be applied within a more generalized hardware implementation.

FIG. 19C illustrates an exemplary recursive search in accordance with the approach described in reference to FIGS. 19A and 19B.

DETAILED DESCRIPTION

Techniques for distinguishing between symmetrically-connected integrated circuit devices so that each device may be individually selected are disclosed in various embodiments herein. In one embodiment, a bi-directional data path provided for ongoing data transfer between a master device and multiple nominally identical slave devices is used to receive a merged set of randomly generated values from the slave devices, and then used to return one or more device-select values that enable assignment of a unique chip-identifier (ID) within each slave device. After chip-IDs have been assigned to the slave devices, the master device may issue one or more chip-select signals corresponding to the unique chip ID assigned to a given slave device and thereby enable that slave device, exclusively of the others, to participate in a data transfer operation over the bi-directional data path. In another embodiment, a recursive search operation is performed to efficiently ascertain nominally unique identifier values pre-loaded or generated within the slave devices. Once ascertained, the identifier values may be used to assign more compact chip IDs to the slave devices and thereby enable efficient device selection.

In a number of embodiments described in detail below, the master device includes circuitry to receive a merged set of random values from the slave devices via a bidirectional data path and to recover the random values corresponding to individual slave devices from the merged set. After recovering the random values, the master device broadcasts each of the recovered values, one after another, to the slave devices via the bidirectional data path and to output a unique chip ID in association with each broadcast recovered value. In such an embodiment, each of the slave devices includes circuitry to enable the merged transfer of random values to the master device. Each slave device also includes circuitry to determine whether the recovered value broadcast by the master device matches the random value generated by the slave device and, if so, to load the corresponding chip ID into a register that permits ID-based device selection. By this operations, chip IDs may be assigned one after another to respective slave devices and used thereafter to permit individual device selection. In a variant of this embodiment, the self-generated random value or an encoded value corresponding thereto may itself be employed as the chip ID, thus avoiding the chip ID assignment operation (i.e., as the master device may recover the individual random values from the merged set of random-values and thereafter output a selected one of the recovered values or encoded version thereof to select the corresponding slave device).

In an alternative embodiment, the master device includes circuitry to generate a mask value that, when logically combined with the random value generated by a given slave device, yields a chip ID corresponding exclusively to that random value. By additionally enabling the master device to broadcast the mask value to the slave devices (e.g., via the bidirectional data path) and by providing logic circuitry within each of the slave devices to combine the self-generated random value with the broadcast mask value, unique chip IDs may be produced and recorded within each of the slave devices simultaneously and in response to a single transmission (i.e., the broadcast mask value) from the master device.

In yet another embodiment, a preloaded (or self-generated) distinguishing value such as a serial number, production number or other signature within otherwise nominally identical slave devices may be ascertained through a recursive search operation in which comparison between search values and signature values are carried out within the slave devices, with the comparison results from all slave devices being returned to the master device concurrently in a merged transfer. The master device uses successive comparison results to efficiently ascertain the signature value for each slave device. The master device applies each signature thus ascertained to assign a more compact chip ID to the corresponding slave device and thereby enable efficient device selection.

Figure 1:
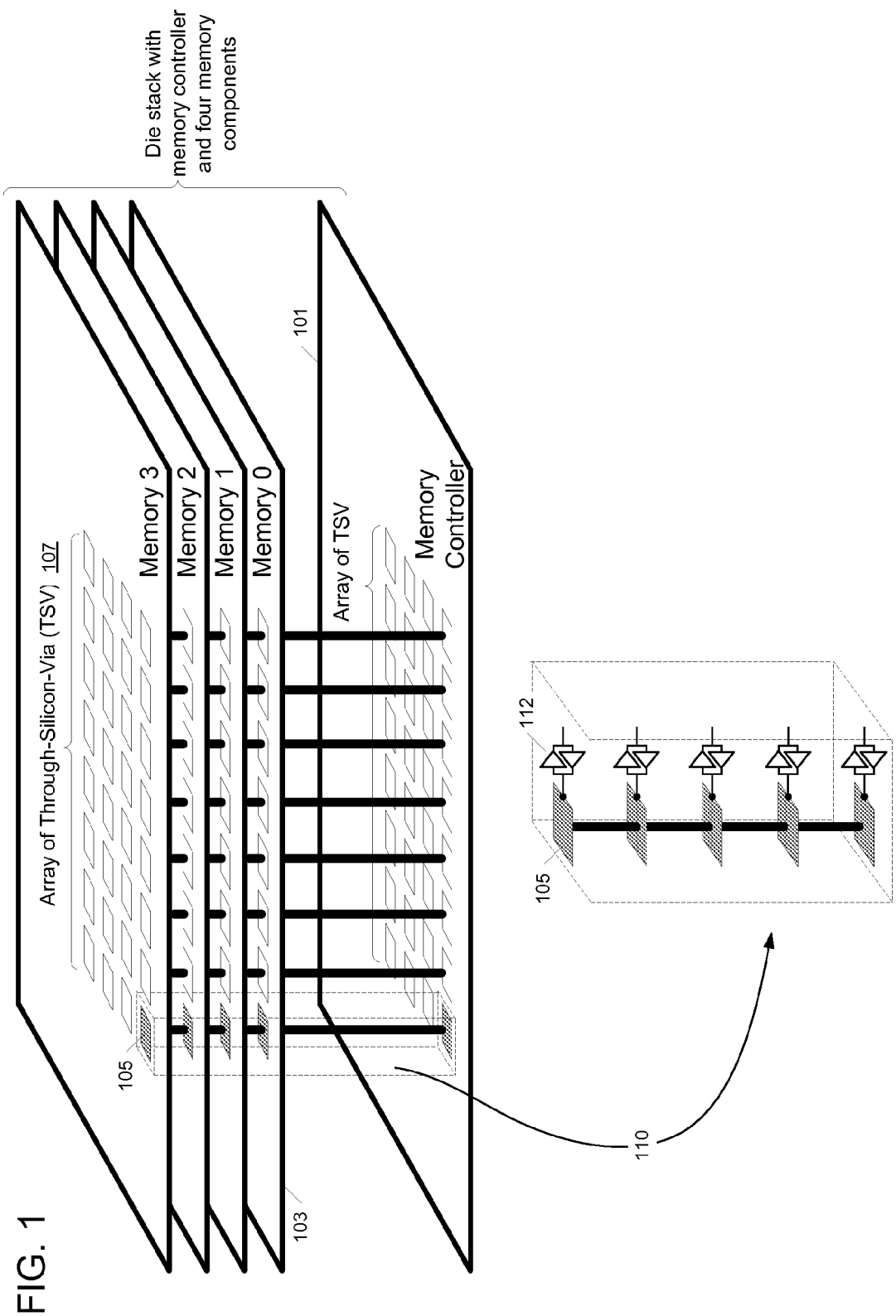
FIG. 1 illustrates an exemplary system of integrated circuit (IC) devices in which chip-selection techniques and corresponding circuitry disclosed herein may be employed.

FIG. 1 illustrates an exemplary system of integrated circuit (IC) devices in which the above-described techniques and corresponding circuitry may be employed. In the particular embodiment shown, the IC devices include a set of four memory devices 103 and a memory controller 101 (which may be, for example and without limitation, a processor, system-on-chip (SOC), IC buffer, application-specific integrated circuit (ASIC), or other control circuitry), with the memory controller operating as a master device and each of the memory devices constituting slave devices that respond to administrative commands (e.g., configuration, calibration, refresh, etc.) and memory access commands from the memory controller. The IC devices are assumed to be implemented in respective IC dice that are disposed in a stack and interconnected at least by a through-silicon via (TSV) array 107. As shown, each through-silicon via 105 extends vertically through the die stack to establish a common connection to each die in the system (i.e., with each TSV 105 being coupled to input and/or output (I/O) circuitry 112 on each IC die as shown in detail view 110). By this arrangement, all the memory dice 103 are symmetrically connected to the memory controller 101 (i.e., the connections between the memory controller and a given memory die are the same as the connections between the memory controller and any other memory die) so that no individual memory die may be distinguished from any other memory die on the basis of signal link interconnections alone. Instead, by employing techniques for distinguishing between integrated circuit dice as generally discussed above (and described in greater detail below), such symmetrically coupled memory dice may be distinguished from one another and thereafter individually selected for memory access operations.

For purposes of explanation, the system of symmetrically-coupled IC dice shown in FIG. 1, including the memory controller and four memory devices, is carried forward in more detailed embodiments described below. In all such embodiments, the specific number and type of devices may be different. Also, while the symmetric interconnections of a TSV array present particular challenges in device identification and selection, the device interconnections need not be TSVs or even symmetric, nor must the memory devices (or other type of slave device) be identically implemented in order for the techniques to be employed. In a memory system embodiment, the integrated-circuit memory devices may be virtually any type of memory device (e.g., dynamic random access memory, static RAM, Flash memory, etc.) and in all cases the memory controller may be implemented by or within a processor, system-on-chip (SOC), IC buffer, ASIC, or any other type of IC having memory control circuitry thereon. More generally, the system may be implemented by numerous other types of devices coupled in a broad variety of interconnection patterns. For example, the system may include integrated circuit devices coupled in cascade or parallel to achieve increased storage capacity, output capability, processing power, power delivery, etc. Thus, the techniques disclosed herein may be employed in virtually any system of integrated circuit devices however interconnected. Moreover, while such system generally is expected to have at least one master device that controls the assignment of chip IDs, such mastership may be temporarily established within a set of memory devices that otherwise transfer mastership to one another from time to time and/or operate as peer devices after chip IDs have been assigned.

Figure 2:
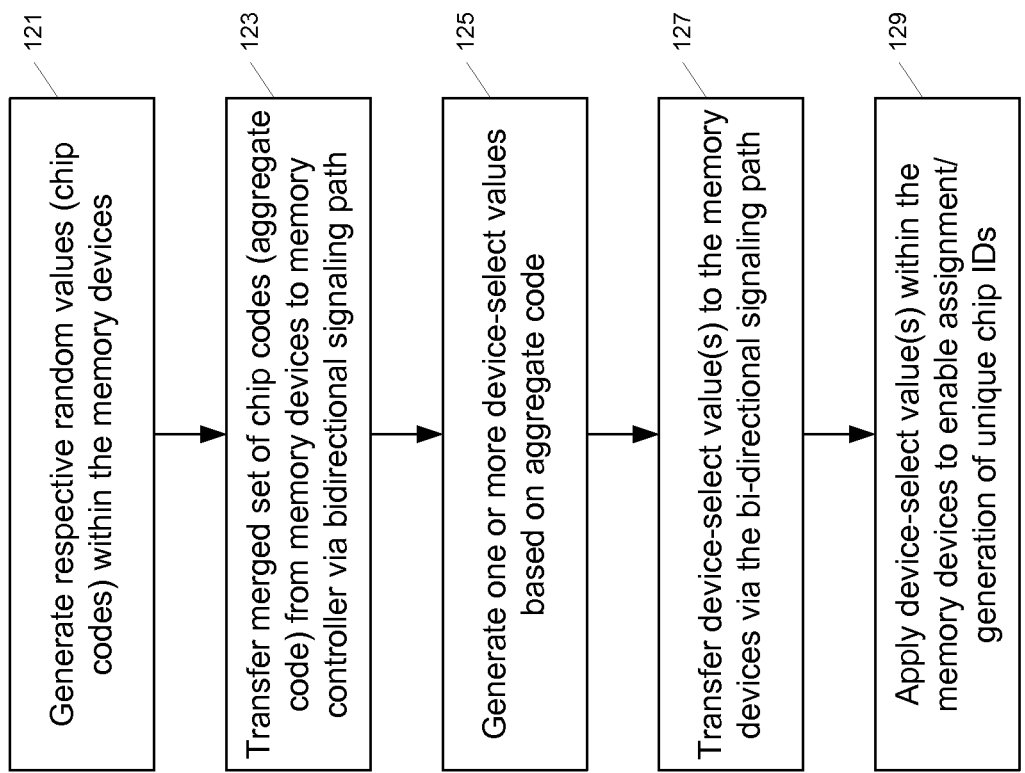
FIG. 2 illustrates a generalized approach for determining and assigning unique chip IDs within the system of FIG. 1.

FIG. 2 illustrates a generalized approach for determining and assigning unique chip IDs within the system of FIG. 1. Initially, at 121, the memory devices are enabled or instructed to generate respective random values. At 123, the random values are transferred to the memory controller in a simultaneous merged transfer over a bidirectional signaling path (i.e., a shared multi-bit path coupled between the memory controller and each of the memory devices), thus providing a merged set of the random values (the "merged random value" or "merged value" for short) to the memory controller. At 125, the memory controller generates one or more device-select value(s) based on the merged value, and at 127 the memory controller transfers the device-select value(s) to the memory devices via the bidirectional signaling path. In one embodiment, for example, the memory controller extracts (or recovers) a set of device-select values that correspond to the individual random values from the merged value and broadcasts those device-select values one after another to the memory devices via the bidirectional signaling path. In an alternative embodiment, the memory controller generates, as the device-select value, a mask value that may be logically combined with the random value generated by each memory device to yield a unique chip ID value. In the latter embodiment, the broadcast of successive device-select values may be avoided, as the same mask value (device-select value) may be applied within all the memory devices to produce unique chip IDs. In both embodiments, successive device-select broadcast or one-time device-select broadcast, the memory devices apply the received device-select value(s) to enable assignment or generation of unique chip IDs as shown at 129. In the case of successively transmitted device-select values, for example, each device-select value may be used to enable a more compact chip ID value to be loaded into a chip ID register (i.e., into the chip ID register of the memory device that sourced a random value that matched the device-select value). Alternatively the device-select value may itself be loaded into the chip ID register and thereafter used as the chip-select value (i.e., enabling exclusive selection of a memory device having a chip ID that matches a later transmitted device-select or chip-select value). In yet another embodiment, discussed below, the device-select value may include a masked query value (e.g., a query value and a mask value) to be compared with an identifying value or signature within each of the memory devices and thus enable determination of the identifying (signature) value.

Figure 3:
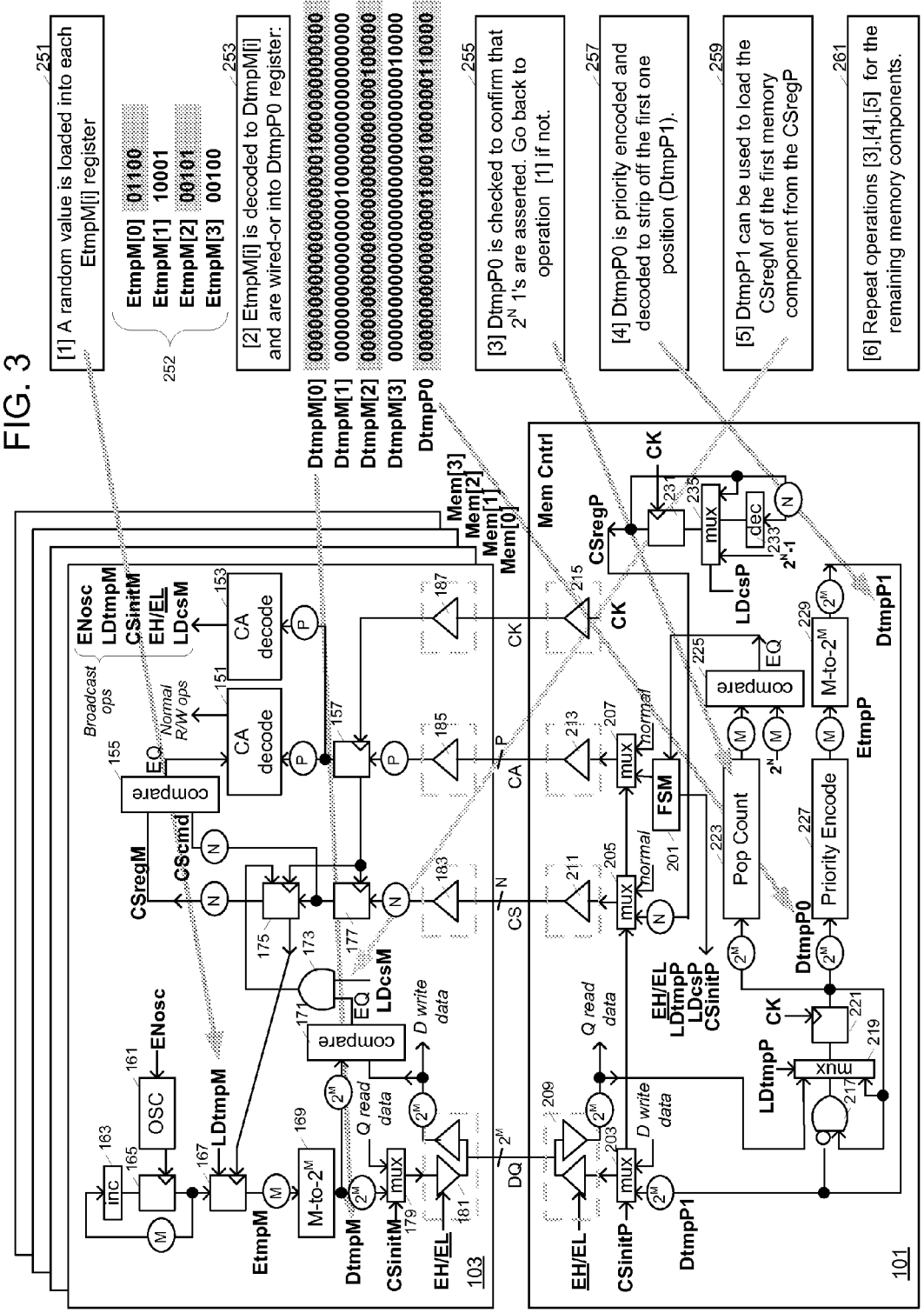
FIG. 3 illustrates an exemplary approach for determining and assigning unique chip IDs in an embodiment of a system of five symmetrically coupled ICs, including a memory controller and four memory devices.

FIG. 3 illustrates an exemplary approach for determining and assigning unique chip IDs in an embodiment of a system of five symmetrically coupled ICs, including a memory controller 101 and four memory devices 103 (Mem[0], Mem[1], Mem[2], Mem[3]). As shown, the chip to chip connections include a bidirectional data bus (DQ), a command/address bus (CA), chip-select lines (CS) and one or more clock lines (CK). Each of the memory devices includes a command/address buffer 157; command/address decoders 151 and 153; a random value generator formed by oscillator 161, state register 165, increment logic 163, signature register 167 and decoder 169; chip-select logic formed by compare circuit 171, load gate 173, chip ID register 175, compare circuit 155 and chip-select buffer 177; data-out multiplexer 179; data driver/receiver circuits 181 coupled to the data bus; and signal receivers 185, 183 and 187 coupled to the command/address bus, chip-select lines and clock line(s), respectively. Though not specifically shown, each of the memory devices 103 also includes a core storage array (e.g., one or more banks of storage cells) and access-control circuitry for carrying out data storage and retrieval operations with respect to the storage array, as well as other maintenance operations (e.g., refresh, timing calibration, signal-detection calibration, cell-failure, etc.). For example, the access/control circuitry responds to a memory read command/address received via the command/address bus by retrieving "read data" from an address-specified bank, row and/or column within the storage array, and then outputting the read data to the memory controller 101 in one or more synchronous or asynchronous transfers over the data bus (i.e., via the "Q read data" input to data-out multiplexer 179). Similarly, the access/control circuitry responds to a memory write command/address received via the CA bus by storing write data (received in one or more transfers over the data bus and delivered to the access/control circuitry as shown by the "D write data" path) at the address-specified bank, row and/or column within the storage array.

Memory controller 101 includes counterpart signal driver/receivers to those on the memory devices 103, including data driver/receiver circuits 209 coupled to the data bus to form a data interface, and signal driver circuits 213, 211 and 215 coupled to the command/address bus, chip-select lines and clock line(s), thus forming a command interface, chip-select interface and clock interface, respectively. The memory controller also includes a number of functional circuits to support chip ID determination and assignment, including a finite state machine 201 (which may alternatively be a sequencer, processor core or other control circuitry) to control chip ID determination and assignment operations, at least; a chip-ID generator formed by state register 231, multiplexer 235 and decrement logic 233; a population verifier formed by population-count logic 223 and compare circuit 225; a device-select generator formed by merge register 221, priority encoder 227, decoder 229, logic gate 217 and multiplexer 219. Multiplexer 203 is provided to select between the output of the device-select generator and a write data source (not shown, but indicated by "D write data") during data transfer operations. Also, multiplexer 205 is provided to select either the chip-ID generator or another chip-select source (not shown, but indicated by the path labeled "normal") to drive the chip-select lines, and multiplexer 213 is provided to select either state machine 201 or another command/address source to drive the command/address lines. As with the memory devices, memory controller 101 may include numerous other circuit blocks not shown, including those devoted to memory control and memory access operations (e.g., outputting memory read/write/management commands and write data, and receiving memory read data or management-related information) and other core functions of a processor or ASIC.

The commands output from memory controller 101 to memory devices 103 may be viewed as falling into one of two classes: broadcast commands which are intended to trigger a responsive operation within all the memory devices, and selective commands which are intended to trigger a responsive operation only within a selected one (or subset) of the memory devices. In the embodiment of FIG. 3, this distinction is shown conceptually at least by the separate command/address decode circuits 153 and 151 which serve as command (or instruction) execution logic circuits for broadcast and selective commands, respectively. The selective decode circuit 151 decodes each incoming command (and issues corresponding control signals to carry out the commanded operation) only if a match signal, EQ, from compare logic 155 is asserted, and thus, only if the contents of the chip ID register 175 match a chip-select value captured within chip select buffer 177 (i.e., a chip-select value output by memory controller 101 in association with the selective command). By contrast, the broadcast decode circuit 153 decodes the incoming command regardless of the chip-select value provided, if any; outputting control signals to carry out the commanded operation if the incoming command code decodes to a valid broadcast command.

Still referring to FIG. 3, upon initial system power up (and/or reset), the contents of chip ID registers 175 within respective memory devices 103 are either unknown or reset to a default value and thus may not be reliably used to distinguish the memory devices for purposes of device-specific operations. In the particular embodiment shown, the generalized sequence of operations 251-261 is carried out to establish a unique chip ID for each memory device. Starting at 251, an M-bit random value referred to herein as a "signature" and depicted as "EtmpM," is generated within the random number generator of each memory device 103 and captured within the capture register 167 (also referred to as the EtmpM[i] register, where 'i' is the index of the memory device, 0 to 3). In the example shown at 252, four distinct, 5-bit signatures (EtmpM[0]-EtmpM[3]) are generated and loaded into signature registers 167 of respective memory devices 103. At 253, the M-bit signature within each memory device is decoded into a corresponding $2^M$-bit, one-hot value (i.e., one bit having a different state from all other bits), referred to herein as DtmpM, and the set of DtmpM values from all the memory devices are merged (wire-ORed in this example) in a simultaneous transfer over the data bus DQ, with the merged result captured as a "DtmpP0" value within merge register 221 (also called the DtmpP register) of the memory controller. In one embodiment, for example, driver/receiver 209 within the memory controller drives (charges) all data links of the data bus high (or sources current to the bus) and driver/receiver 181 within each memory device pulls low (discharges) only one of the data links corresponding to the single logic high bit (or single logic low bit) within the decoded signature, DtmpM[i] (where T is the memory device index, 0 to 3), thereby effecting a wired-OR (or wired-AND, depending upon perspective) of the four DtmpM values. The DtmpM[i] values and DtmpP0 value produced in response to the exemplary EtmpM values at 252 are shown at 254.

Still referring to FIG. 3, if the four original signatures were unique (i.e., each signature different from the other three), each decoded signature, DtmpM, will have a single '1' bit (or a single '0' bit if inverted logic states are used) in a different position than all the other decoded signatures and thus the merged result, DtmpP0 will include four logic '1' bits, each corresponding to a respective one of the DtmpM values. Accordingly, as shown at 255, population count logic 223 generates a count of the number of logic '1' bits within the DtmpP0 value (i.e., a "population count") and compare logic 225 compares the population count with an expected count, $2^N$ (where N is the number of chip-select lines (CS), and $2^N$ is the number of memory devices 103, so that N=2 in this example). If the population count matches the expected count, the compare logic 225 raises equality signal (EQ) to inform state machine 201 that the expected device population was detected and therefore that signature generated by each device is unique. In that case, the chip ID assignment proceeds at operation 257. Otherwise the signature generation and merger operations at 251 and 253 are repeated.

At 257, the DtmpP0 value is priority encoded to extract a one-hot DtmpP1 value having a single '1' in the same bit position as the least-significantly positioned '1' in the DtmpP0 value (i.e., 0000 . . . 010000 in the example shown), in effect recovering the decoded signature generated on one of the memory devices. Consequently, the DtmpP1 "device-select" value may be combined with the DtmpP0 value to clear (i.e., mask or strip) the least significant '1' from the DtmpP0 value (and thus enabling recovery of the decoded signature that yielded the next least-significant bit therein) and output to memory devices 103 via the data bus to enable assignment of a chip ID exclusively to the memory device that generated the corresponding decoded signature. Thereafter, the operations 255, 257 and 259 are repeated (i.e., as shown at 261) to sequentially recover and output device-select values (DtmpP1) corresponding to the remaining memory devices, and thereby assign chip IDs to the remaining memory devices in succession.

Figure 4A:
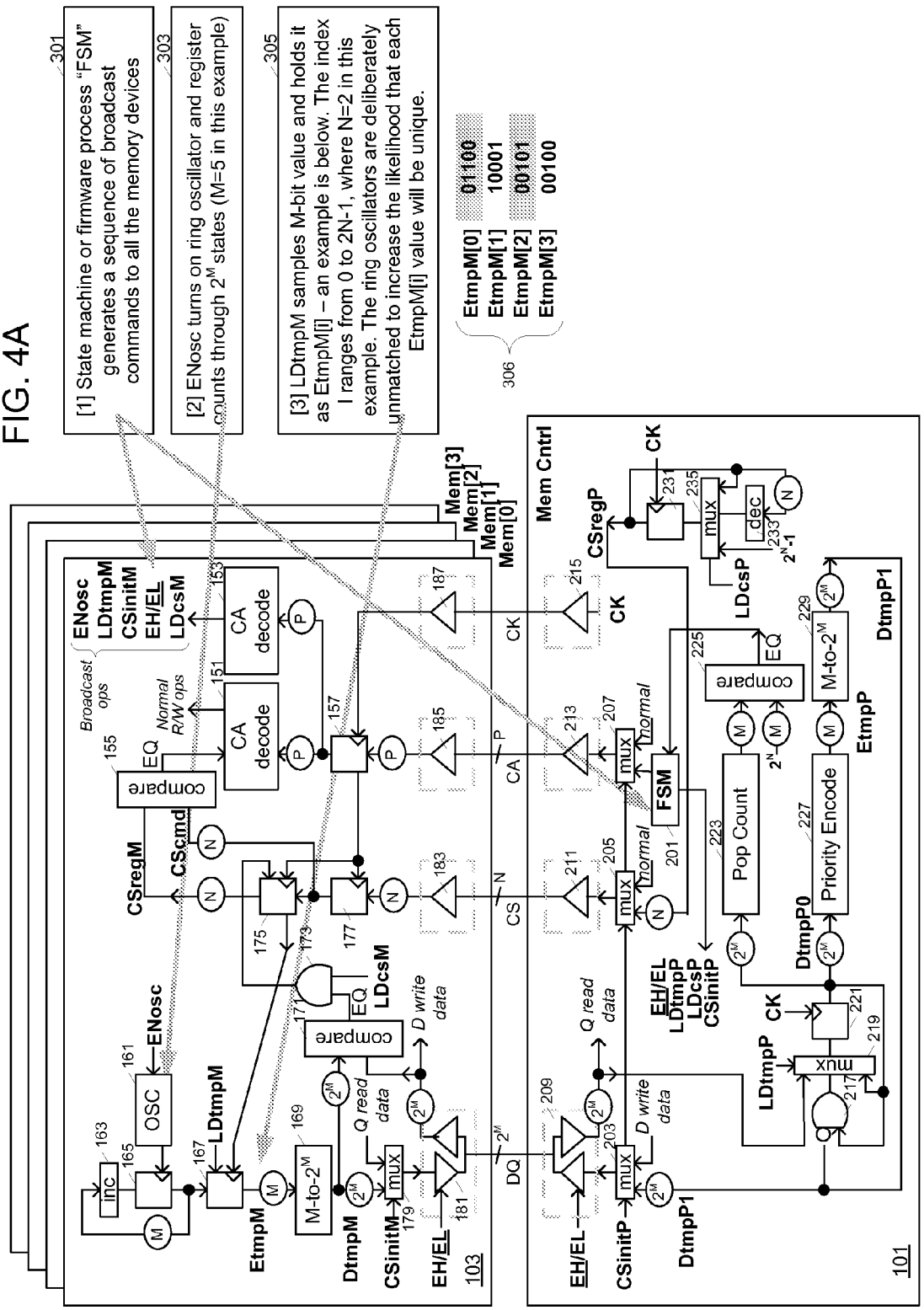
FIGS. 4A-4D illustrate the exemplary operations depicted in FIG. 3 in greater detail and in reference to the same exemplary system embodiment.

FIGS. 4A-4D show the exemplary operations depicted in FIG. 3 in greater detail and in reference to the same system architecture. As shown in FIG. 4A at operation 301, the state machine 201 (which may be implemented by a sequencer, programmed processor or other control circuit as explained above) broadcasts a sequence of commands on the control/address bus (CA) to control chip ID assignment operations within the memory devices 103. As shown at 303, the first of the broadcast commands, ENosc, switches on oscillator 161 within each of the memory devices so that the value within state register 165 is incremented in response to each oscillation (i.e., counting through $2^M$ states from 0 to $2^M-1$, with M=5 in the example shown). After a brief count interval, the state machine 201 broadcasts the LdtmpM command to disable oscillator 161 and load the content of state register 165 into signature register 167 as the random signature, EtmpM, described above. That is, the signature register 167 within each of the four memory devices 103 samples a respective M-bit random value so that a set of likely-unique M-bit signature values is captured as shown by the exemplary set of signatures at 306.

Figure 6:
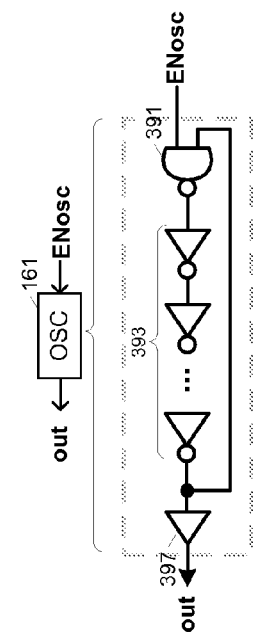
FIG. 6 illustrates an exemplary embodiment of a ring oscillator that may be used to implement the oscillator within each of the memory devices of FIGS. 3 and 11.

FIG. 6 illustrates an exemplary embodiment of a ring oscillator (i.e., formed by enable gate 391, series-coupled inverter stages 393 and output buffer 395 that may be used to implement oscillator 161 within each of the memory devices, though other types of oscillation circuits may be used in alternative embodiments. As mentioned at 305, the oscillators may be deliberately unmatched (i.e., implemented to be process and/or environmentally sensitive, for example, by using relatively small transistors that naturally exhibit a greater degree of switching-speed variation from instance to instance) to increase the likelihood of oscillator frequency deviation from memory device to memory device. Consequently, after even an extremely brief count interval (e.g., tens of nanoseconds, though shorter or longer count intervals may be instituted) the count values within respective state registers 165 are likely to be unique and thus yield a unique set of signatures as shown in the example at 306.

Figure 4B:
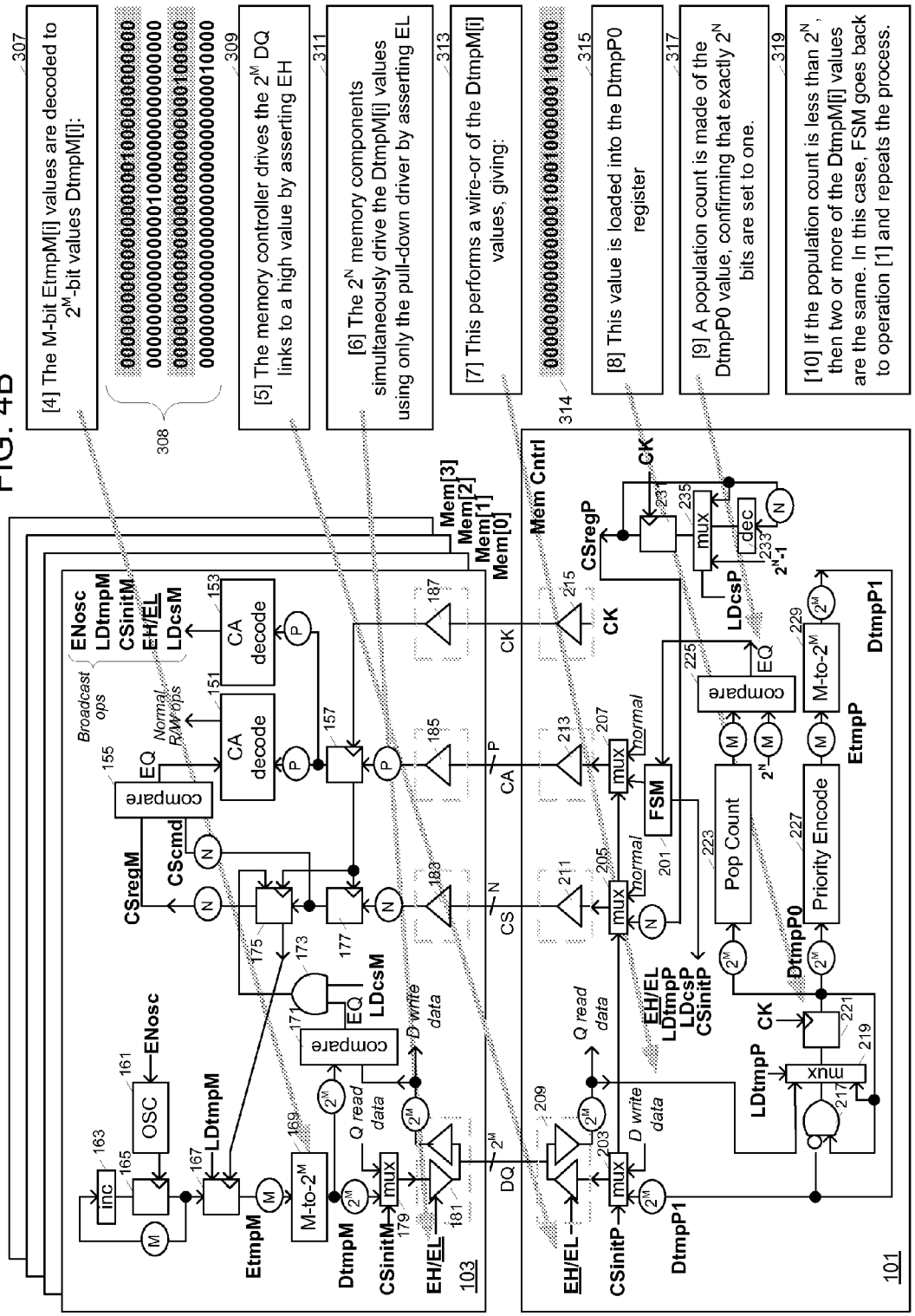

Turning to operation 307 of FIG. 4B, each signature, EtmpM, is decoded within respective decoder 169 to produce a one-hot (i.e., single logic high bit) random value referred to herein as a "decoded signature," DtmpM. In the particular embodiment shown, the decoding operation expands the encoded M-bit signature into a $2^M$-bit decoded signature having a logic high bit in the bit position that corresponds to the numeric value of the source EtmpM value. Thus, in the example shown in FIGS. 4A and 4B, EtmpM[0]=01100b ('b' for binary) or decimal value 12, and the corresponding DtmpM value has a single logic high bit in the corresponding bit position (i.e., bit position 13, as a one-hot bit in the first bit position corresponds to encoded value 00000b). Similarly, EtmpM[1]=17, so that DtmpM[1] has a solitary logic high bit (i.e., one-hot) in the eighteenth bit position; EtmpM[2]=5, so that DtmpM[2] has a high bit in the sixth bit position, and EtmpM[3]=4, so that DtmpM[3] has a high bit in the fifth bit position. The complete set of decoded signatures is shown at 308.

Figure 10:
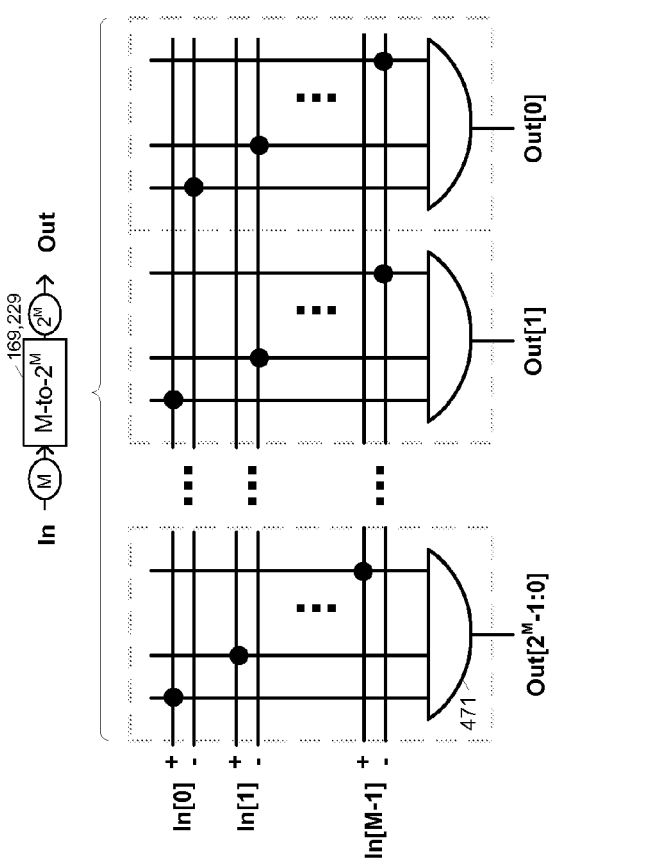
FIG. 10 illustrates an embodiment of a decoder circuit that may be used to implement decoders within the memory controller and memory devices of FIG. 3.

FIG. 10 depicts an exemplary implementation of an M-bit to $2^M$-bit decoder that may be used to implement decoders 169 and 229 of FIGS. 3 and 4A-4D. As shown, each of $2^M$ output bits is generated by a respective AND gate 471 as a logical AND of particular high/low combinations of the M input bits. Thus, Out[0] is high if all input bits are low (i.e., all In[i]-lines high), Out[1] is high if In[0] is high (i.e., In[0]+ high) and all other input bits are low, and so forth to Out[$2^M-1$] which is high if all input bits are high.

Continuing at operation 309 of FIG. 4B, state machine 201 issues control signal EH/EL to the data driver/receiver within the memory controller 101 to drive the $2^M$ DQ links high and thereby enable the memory devices 103 to selectively pull-down links of the DQ bus corresponding to the one-hot bits within their respective decoded signatures. Thus, after (or while) the memory controller drives the DQ links high, the memory controller broadcasts CSinitM and EH/ELcommands to the memory devices to select the DtmpM values to be supplied to driver/receiver 181 (i.e., by operation of multiplexer 179 in response to assertion of a CSinitM signal) and to enable a pull-down only mode within driver/receiver 181. By this operation, each of the memory devices selectively pulls down one of the DQ links corresponding to the logic high bit within its decoded signature, DtmpM (i.e., assuming a logic low DQ signal in response to logic '1' data, which may be reversed in alternative embodiments), thus simultaneously driving the DtmpM[i] values onto the DQ links using only the pull-down driver as shown at 311 and thereby merging the $2^N$ DtmpM values on the DQ links in a wired-OR combination (which may be viewed as a wired-AND of the inverted DtmpM values) as shown at 313. The resulting merged set of decoded signatures, shown for example at 314, is received within the memory controller via the bidirectional signal links and presented to an input of multiplexer 219. As shown at 315, state machine asserts signal LDtmpP to load the merged set of decoded signatures into merge register 221 as merged signature value (or merged random value or aggregated random value), DtmpP0.

Figure 4C:
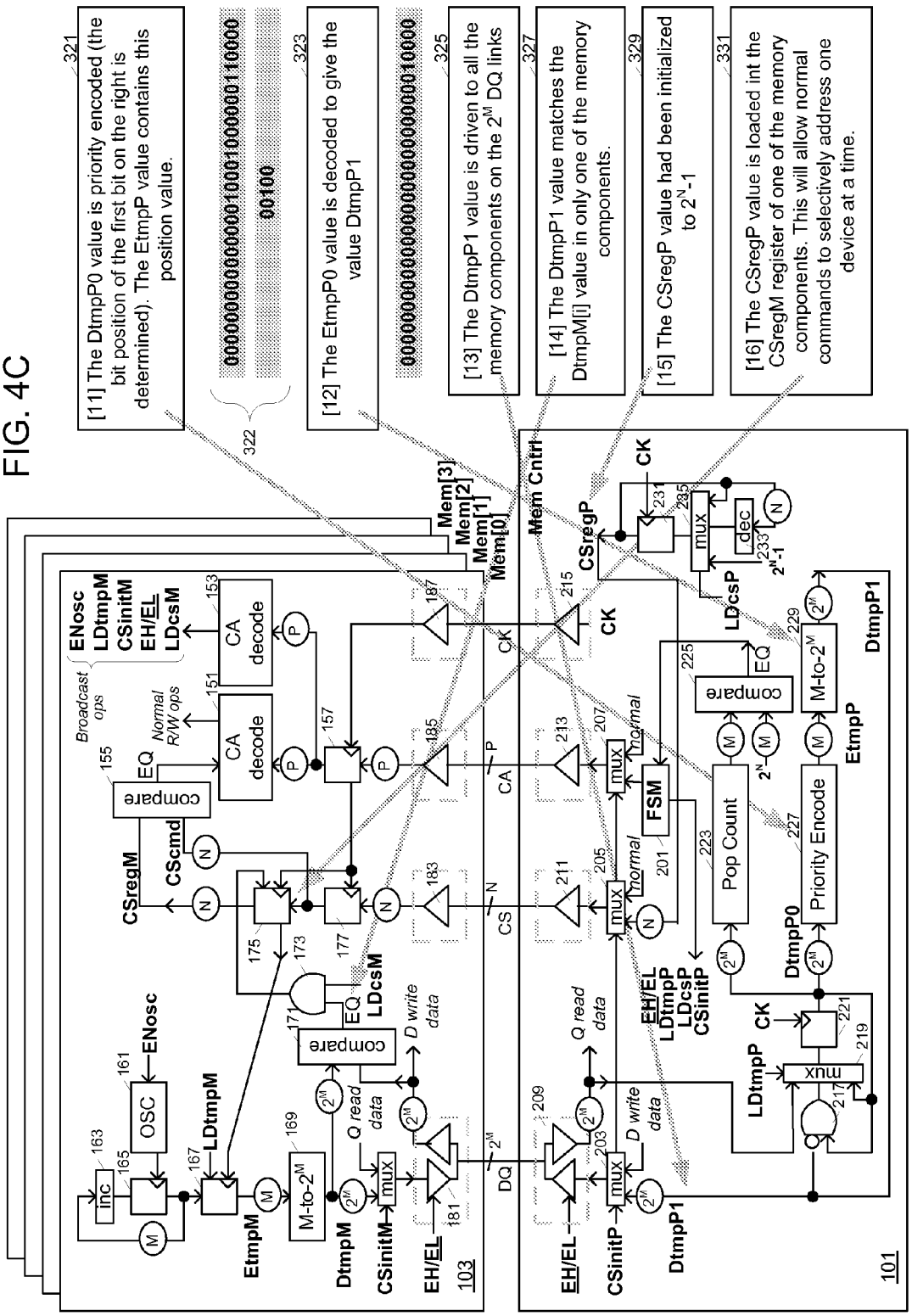
Figure 4D:
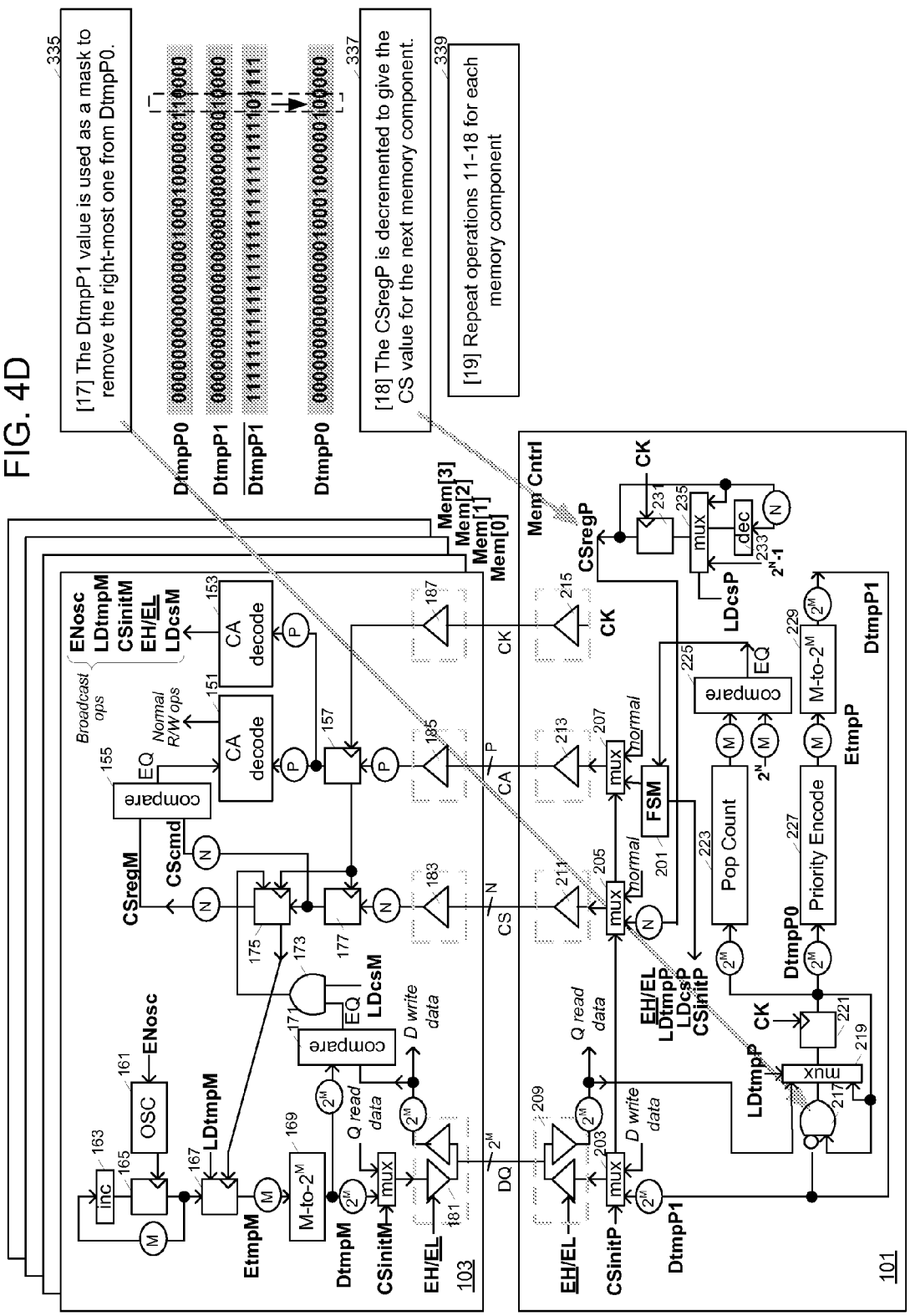
Figure 5A:
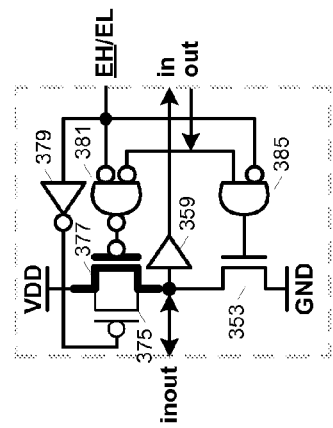
FIGS. 5A-5C illustrate exemplary embodiments and operation of a bimodal driver/receiver circuit that may be used to implement the driver/receiver circuits and within the system of FIGS. 3 and 11.
Figure 5B:
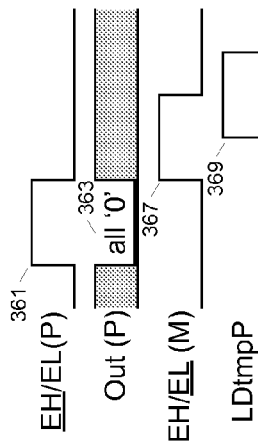
Figure 5C:
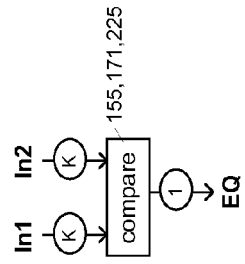

FIGS. 5A-5C illustrate exemplary embodiments and operation of a bimodal driver/receiver circuit that may be used to implement the driver/receiver circuits 181 and/or 209 within the memory controller and memory devices. In one embodiment, shown in FIG. 5A, logic gates 355 and 357 are used to selectively enable operation of pull-down (drive '1') and pull-up (drive '0') drive transistors (353 and 351, respectively) and thus enable exclusively pull-down signaling mode (i.e., EL=1, EH=0) within the memory devices and exclusively pull-up signaling mode (EH=1, EL=0) within the memory controller. After the chip assignment operations shown in FIG. 3 and FIGS. 4A-4D are completed, a pull-up/pull-down driving mode may be enabled within the driver/receivers of the memory controller and memory devices to enable bidirectional transmission of logic '1' and logic '0' data. Although a single-ended driver/receiver for a single data link is shown, a similarly controlled differential implementation may be used in alternative embodiments, and the driver/receive may be provided in as many instances as necessary to drive/receive data signals in parallel over the constituent links of the data bus. Active high signaling (i.e., pull-up in response to logic '1', down in response to logic '0') may alternatively be used, with commensurate change in the data state used to generate the controller-side pull-up (logic '1' instead of logic '0') and memory-side pull-down (single logic '0' bit in decoded signature instead of single logic '1' bit). Also, while not specifically shown, additional gating logic may be provided for clock or strobe-based timing control (i.e., to control the sampling time of data received in receiver 359 and to control the output time of data transmitted via the signal driving elements 351, 353. Further, in the embodiment of FIGS. 3 and 4A-4D at least, enable-high gate 355 may be omitted from the driver/receiver within memory devices 103 and enable-low gate 357 may be omitted from the memory controller 101.

Depending on the strength of the pull-up transistor 351, simultaneous data-link pull-up (at the memory controller) and pull-down (at the memory device), may result in undue current draw through the memory-side and/or controller-side signal driver. In one embodiment, this is avoided by enabling the controller-side pull-up operation and the memory-side pull-down operation in successive time intervals. FIG. 5B illustrates an exemplary sequence of such a pulse-and-release operation that avoids contending data link pull-up and pull-down by the signal drivers on the memory controller and memory devices. To complete a pull-up and release cycle, the state machine first asserts the EH signal as shown at 361 and supplies '0' data to each driver/receiver as shown at 363, thereby switching on the enable-high gate 355 within each driver/receiver and thus pulling all the DQ links high. After a brief pull-up interval (e.g., one or more clock cycles or a fraction of a clock cycle), the memory controller lowers the EH signal as shown and thus switches off both driver transistors 351 and 353 (i.e., signal EL is already low) within each link driver/receiver to present a high-impedance (i.e., tri-state) to the charged-high DQ links. Immediately thereafter, the EH/EL command is applied within the memory devices as shown at 365 (i.e., the command having been output by the memory controller in advance to enable corresponding EH/EL signal assertion at the appropriate time) to enable the DQ links to be selectively discharged according to the positions of the logic '1' bits within the respective decoded signatures, DtmpM[i]. Though not shown, the CSinitM signal is applied within the memory devices concurrently with the EH/EL signal in response to the CSinitM command, which may be broadcast immediately before (or concurrently with) the EH/EL command, or earlier in the chip ID assignment operation. Shortly after the memory devices have been enabled to selectively discharge the DQ links (i.e., in response to the EH/EL command), the LDtmpP signal is asserted by state machine 201 as shown at 367 to capture the resulting merged signature, DtmpP0, within the memory controller's merge register 221.

FIG. 5C illustrates an alternative driver/receiver embodiment in which a relatively weak (e.g., small) pull-up transistor 375 is provided in parallel with a stronger data-drive transistor 377. By this arrangement, the weak pull-up transistor 375 may be switched on in response to assertion of an EH/EL signal (i.e., by operation of inverter 379) to establish a pull-up resistance for purposes of wired-OR transfer (and without requiring data of a particular state to be provided). Thus, instead of sequential pull-up and sample operations as shown in FIG. 5B, the memory controller may assert the EH/EL signal concurrently with the pull-down operation of the memory devices to receive the merged signature value. When the EH/EL signal is low, a two-state signaling mode is enabled via gates 381 and 385.

Continuing at operation 317 of FIG. 4B, the merged signature value is output from merge register 221 to population count logic 223 and priority encoder 227 via the $2^M$-bit paths shown. As discussed above, the population count logic outputs a population count (i.e., the number of logic '1' bits within DtmpP0) to compare circuit 225, which in turn asserts EQ signal if the expected population count is detected. In this four-memory-device example (i.e., N=2), if fewer than four '1's are detected, the state machine 201 returns to the operation at 303 (i.e., as shown by the operation at 319) to re-broadcast the ENosc commands and proceed again with random value generation and merged transfer. Otherwise, the state machine proceeds with the chip ID assignment operations shown in FIG. 4C.

Figure 7:
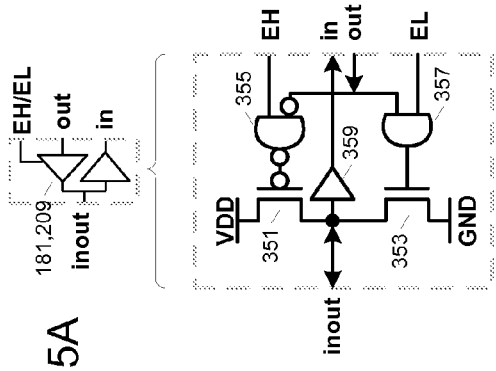
FIG. 7 illustrates an exemplary embodiment of a comparator circuit that may be used to implement comparator circuits within the memory controller and memory devices of FIG. 3.

FIG. 7 illustrates an embodiment of a comparator that may be used to implement the compare circuit 225 of FIGS. 3 and 4A-4D, and also the compare circuits 171 and 155. As shown, the comparator includes a set of exclusive-NOR gates 401 that generate match outputs for respective pairs of input bits from the two values being compared (generalized as values In1 and In2, each having K constituent bits), and a chain of AND gates 403 that effectively AND all the comparison results. Thus, if the two values being compared (i.e., the "comparands") match at each bit position, the outputs of all the exclusive-NOR gates will be high, thereby yielding a logic high EQ signal at the output of the AND-gate chain. Conversely, if the comparands are mismatched at any single bit position, the output of the corresponding exclusive-NOR gate 401 will be low, resulting in a logic low EQ signal at output of the AND-gate chain.

Figure 8:
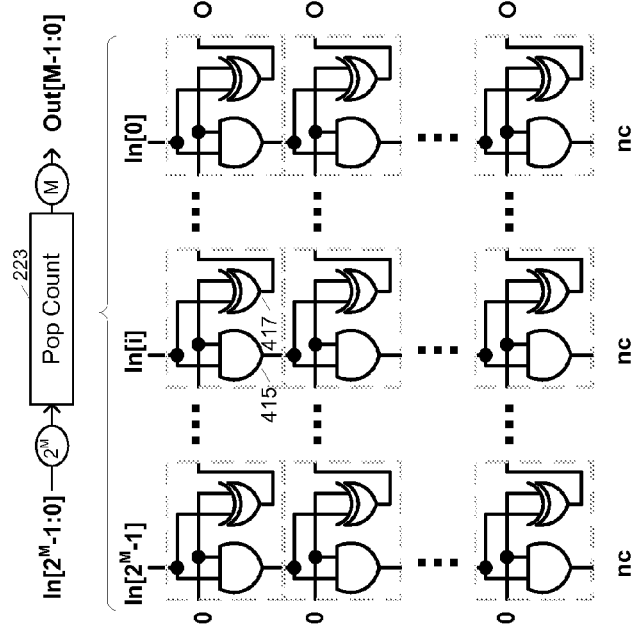
FIG. 8 illustrates an exemplary embodiment of a population count circuit that may be used to implement the population count logic within the memory controller of FIG. 3.

FIG. 8 illustrates exemplary population count logic that may be used to implement population count logic 223 of FIGS. 3 and 4A-4D. As shown, the population count logic includes a number of rows of add/carry cells, with each cell including a respective AND gate 415 and exclusive-OR gate 417 having inputs coupled in parallel and outputs couples as shown. Each row of add/carry cells generates a modulo-2 sum of the input bits to that row via operation of the exclusive-OR gates 417, and outputs any carry value (i.e. resulting from the sum to logic '1' inputs) to be the input to the next row via operation of the AND gates 415. Thus an input value, In[$2^M$−1:0], having four logic '1's yields a sum of zero in the initial row of add/carry cells (i.e., Out[0]=0), and a carry of two as the input to the subsequent row. Consequently, the subsequent row of add/carry cells yields a sum of zero (Out[1]=0), and a carry of one, so that the next row yields a sum of 1 (Out[2]=1) and a carry of zero (and thus a zero-valued output and carry in each subsequent row). Accordingly, the desired value '00100b' or decimal 4 is obtained. The population count logic may be simplified in view of the fact that no value greater than $2^N$ (four in this example) or less than $2^N-1$ are meaningful beyond possible error indication. Also, various other circuits may be used to determine the population count, including state-based logic such as a shift-register and counter (i.e., counting the number of '1's shifted out of the shift register) or a programmed processor.

Continuing with operation 321 of FIG. 4C, priority encoder 227 generates an M-bit numeric value representative of the bit position of the rightmost (or leftmost) '1' within DtmpP0 as shown in the example at 322. Decoder 229 expands the numeric value from priority encoder 227 into a one-hot, "device-select" value (DtmpP1) as shown at 323, effectively recovering one of the four $2^M$-bit random values originally generated by the memory devices. The device-select value is supplied to driver/receiver 209 via multiplexer 203 (i.e., CSinitP remains asserted during the chip-ID assignment operation) and state machine 201 enables the driver/receiver to output the device-select to all the memory devices via the bidirectional data bus as shown at 325. An N-bit chip ID value, CSregP, is output to all the memory devices (i.e., via multiplexer 205 and the chip-select lines (CS) concurrently with transmission of the device-select value, DtmpP1, and state machine 201 issues a broadcast command, LDcsM, to the memory devices to enable selective assignment of the CSregP value within one of the memory devices. More specifically, each of the memory devices responds to the LDcsM command by asserting the corresponding LDcsM signal at the input of load gate 173. If compare circuit 171 indicates (by raising EQ) that the incoming device-select value, DtmpP1, matches the self-generated decoded signature, DtmpM (a circumstance that will occur within only one of the four memory devices for a given device-select value), the output of load gate 173 goes high to enable the chip ID value within chip-select buffer 177 to be loaded into chip ID register 175. By this operation, the chip ID value, CSregP, is assigned (i.e., gated into chip ID register 175) exclusively within the memory device that generated the device-select-matching signature. In the example shown at 327, 329 and 331, the CSregP value had been initialized to $2^N-1$ (i.e., by assertion of the LDcsP signal in a state that selects the $2^N-1$ value to be loaded into state register 231 via multiplexer 235), so that '11b' is the first chip ID assigned. Accordingly, after all the other memory devices have received alternate chip ID assignments (i.e., chip ID values other than '11b'), the memory controller may selectively command the memory device assigned the '11b' ID by asserting chip-select value '11b' on the chip-select lines in association with a selective command/address conveyed on the CA bus.

Referring to operation 335 in FIG. 4D, the device-select value (DtmpP1) and DtmpP0 value are supplied to inverting and non-inverting inputs of logic AND gate 217 which, in response, produces an updated merged signature in which the rightmost '1' has been removed (i.e., cleared or masked). State machine 201 outputs the LDtmpP signal in a state that enables the output of AND gate 217 to be loaded into merge register 221 (i.e., via multiplexer 219), thereby loading the updated merged signature (i.e., an updated DtmpP0 value) into merge register 221. At this point, the priority encoder 227 and decoder circuit 229 operate as described in reference to FIG. 4C to generate an updated DtmpP1 value (i.e., corresponding to the new rightmost '1' in bit position eighteen) which is output to the memory devices to enable assignment of a subsequent chip ID value. The finite state machine outputs a LDcsP signal to multiplexer 235 to pass the output of decrement logic 233 to state register 231 and thereby load the state register with chip ID '10' (i.e., '11b' decremented by '1'). Consequently, when the updated DtmpP1 value is output to the memory devices and compared with their respective decoded signatures, the memory device that sourced the matching decoded signature will be assigned the decremented chip ID value. The memory controller continues to generate and output successive device-select values (i.e., DtmpP1 values) and chip ID values for each remaining logic-high bit in the merged signature, thereby completing assignment of unique chip IDs to the remaining two memory devices.

Figure 9:
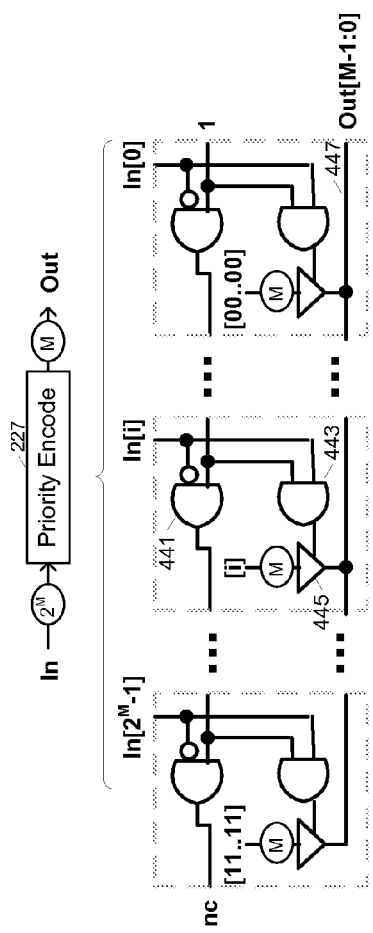
FIG. 9 illustrates an embodiment of a priority encoder that may be used to implement the priority encoder within the memory controller of FIG. 3.

FIG. 9 illustrates an embodiment of a priority encoder that may be used to implement the priority encoder 227 of FIGS. 3 and 4A-4D. As shown, a sequence of AND gates 441 are coupled in a chain, with an inverting input of each AND gate 441 coupled to receive a respective one of input bits In[$2^M$−1:0] and the output of each AND gate 441 being coupled to a non-inverting input of the next AND gate in the chain (the non-inverting input of the first AND gate 441 in the chain being tied high, and the final AND gate in the chain being unnecessary). By this arrangement, the least significant logic '1' bit in the input value will produce a logic low output from the corresponding AND gate 441 and thus render the outputs of the remainder of the AND gates 441 in the chain low. The signal provided at the non-inverting input of each AND gate 441 is also supplied to a counterpart AND gate 443 along with the corresponding bit of the input value. The output of each AND gate 443 controls a passgate or tri-state buffer 445 which either couples or decouples a respective encoded M-bit value ([00.00], . . . , [i], . . . [11.11]) to the priority encoder output 447, with each encoded value corresponding to a respective bit position within the $2^M$-bit input value. With this configuration, the least significant logic '1' bit within the input value will be paired with a logic high AND-gate-chain output so that the AND gate 443 at the least-significant logic '1' input bit position will couple the corresponding encoded value to priority-encoder output 447 via counterpart passgate 445. The logic low output of AND gate 441 that receives the least-significant logic '1' bit will propagate through the remainder of the AND gates 441 in the chain so that no encoded values corresponding to more significant input bit positions will be coupled to the priority-encoder output, regardless of the input bit state. Thus, an M-bit code, Out[M−1:0], corresponding to the least-significant bit of the $2^M$-bit merged signature value is produced at the priority encoder output 447. Other combinatorial logic circuits, or even state-based circuits (e.g., state machine or processor) may be used to perform the priority-encoding function in alternative embodiments, including embodiments that perform both the priority-encoding and 2M to M-bit decoding function. For example, in one alternative embodiment, the decoding circuit 229 of FIGS. 3 and 4A-4D is omitted and the outputs of AND gates 443 (i.e., in FIG. 9) are applied as the recovered signature, DtmpP1. In such an embodiment, passgates 445 and their hardwired inputs may be omitted.

FIG. 11 illustrates an exemplary approach for determining and assigning unique chip IDs in an alternative embodiment of a system of five symmetrically coupled ICs, including a memory controller 501 and four memory devices 503. As in the embodiment of FIGS. 3 and 4A-4D, the chip to chip connections include a bidirectional data bus (DQ), a command/address bus (CA), chip-select lines (CS) and one or more clock lines (CK). Each of the memory devices 503 (Mem[0], Mem[1], Mem[2], Mem[3]) includes a command/address buffer; command/address decoders 151 and 153; a signature generator (also referred to as a random value generator) formed by oscillator 161, state register 165, increment logic 163, capture register 167 and decoder 169; chip-select logic formed by mask register 521, mask logic 523, chip-select buffer 177 and compare circuit 155; data driver/receivers 181 coupled to the data bus; and signal receivers 185, 183, 187 coupled to the command/address bus, chip-select lines and clock line(s), respectively. Though not shown, each of the memory devices also includes a core storage array (e.g., one or more banks of storage cells) and access-control circuitry for carrying out data storage and retrieval operations with respect to the storage array, as well as other maintenance operations (e.g., refresh) all as generally described in reference to FIG. 3.

Memory controller 501 includes counterpart signal driver/receivers to those on the memory devices, including data driver/receivers 209 coupled to the data bus and signal driver circuits 213, 211, 215 coupled to the command/address bus, chip-select lines and clock line(s), respectively. The memory controller also includes a number of circuits to enable chip ID determination and assignment, including a finite state machine 540 (or sequencer, programmed processor or other control logic) to issue a sequence of signals/commands associated with chip ID determination/assignment; and a device-select generator formed by merge register 541, priority encoder/population verifier 543 and mask generation logic 545. A data multiplexer 203 is also provided to select between the output of the device-select generator (more specifically, the mask generation logic 545) and a write data source (not shown) during data transfer operations, and a command multiplexer 207 is provided to select between an output of state machine 540 and a command queue (not shown). As with memory devices 503, memory controller 501 may include numerous other circuit blocks not shown, including those devoted to memory control operations (e.g., outputting memory read/write/management commands and write data, and receiving memory read data and, if useful, status or maintenance-related information) and other core functions of a processor or ASIC.

As in the embodiment of FIG. 3, commands output from the memory controller via the command/address bus may be viewed as falling into one of two classes: broadcast commands intended to trigger a responsive operation within all the memory devices, and selective commands intended to trigger a responsive operation only within a selected one (or subset) of the memory devices. Accordingly, separate command/address decode circuits 153 and 151 are provided for broadcast and selective commands, respectively. The selective decode circuit 151 decodes the incoming command (and issues corresponding control signals to carry out the commanded operation) only if a match signal (EQ) from compare logic 155 is asserted, and thus, only if a chip ID value, CSmask, from mask logic 523 (i.e., CS Mask logic) matches a chip-select value captured in the chip-select buffer 177 (i.e., after being output by memory controller 501 in association with the selective command). By contrast, the broadcast decode circuit 153 decodes the incoming command regardless of the chip-select value provided, if any; outputting control signals to carry out the commanded operation if the incoming command code decodes to a valid broadcast command.

Still referring to FIG. 11, upon initial system power up (and/or reset), the CSmask values generated within respective memory devices are either unknown or reset to default values (e.g., by zeroing the contents of signature register 167 and mask register 521) and thus may not be reliably used to distinguish the memory devices for purposes of device-specific operations. In the embodiment shown, the sequence of operations 561-573 is carried out to establish a unique CSmask value for each memory device and thus permit the memory controller to select individual memory devices for exclusive access (i.e., by issuing a chip-select value on chip-select lines, CS, that matches the CSmask for the device to be accessed). Starting at 561, an M-bit signature (i.e., random value), EcsM, is generated within the signature generator of each memory device and captured within signature register 167 (also referred to as the EcsM[i] register, where T is the index of the memory device, 0 to 3). In the example shown at 562, four distinct, 5-bit signatures (EtmpM[0]-EtmpM[3]) are generated and loaded into signature registers 167 of the respective memory devices. At 563, the encoded signature within each memory device is decoded (i.e., within decoder 169) into a $2^M$-bit, one-hot value, referred to herein as a decoded signature (DcsM), and the decoded signatures from all four memory devices are merged by concurrent transfer over the data bus, with the merged result captured as a merged signature set (DcsP) within the memory controller's merge register 541 (also referred to herein as the DcsP register). In one embodiment, for example, the driver/receiver 209 within the memory controller drives all the data links of the data bus high and the driver/receiver circuits 181 within respective memory devices pull low only one of the data links corresponding to the single logic high bit within the decoded signature for that memory device, thereby effecting a wired-OR (or wired-AND, depending upon perspective) of the four decoded signatures. Accordingly, so long as the original four signatures, EcsM[i], values were unique, four distinct decoded signatures (DcsM) will be generated by the four memory devices, and thus the merged result, DcsP, should include four logic '1' bits, each corresponding to a respective one of the DcsM values. To confirm this result, the priority encoder/population verifier 543 counts the number of '1's in the merged set of signatures (DcsP) as shown at 565, asserting a "Count1s" signal at an input of state machine 540 if the number of '1's matches the expected memory device count. If the population count matches the expected count (i.e., Count1s asserted), state machine 540 proceeds with the chip ID assignment at operation 567. Otherwise the state machine repeats the random value generation and merged signature transfer operations at 561 and 563.

In addition to confirming the population count, the priority encoder separates the merged signature set into constituent one-hot values, and outputs an M-bit encoded value of each, in effect, recovering the four encoded signatures (i.e., EcsM values) generated within the four memory devices as a 4×M matrix, R[j][h], where each row (denoted by index, [j]) corresponds to a respective one of memory devices 0-3, and each column (denoted by column index, [h]) corresponds to a respective bit position within the set of recovered M-bit signatures.

Figure 12:
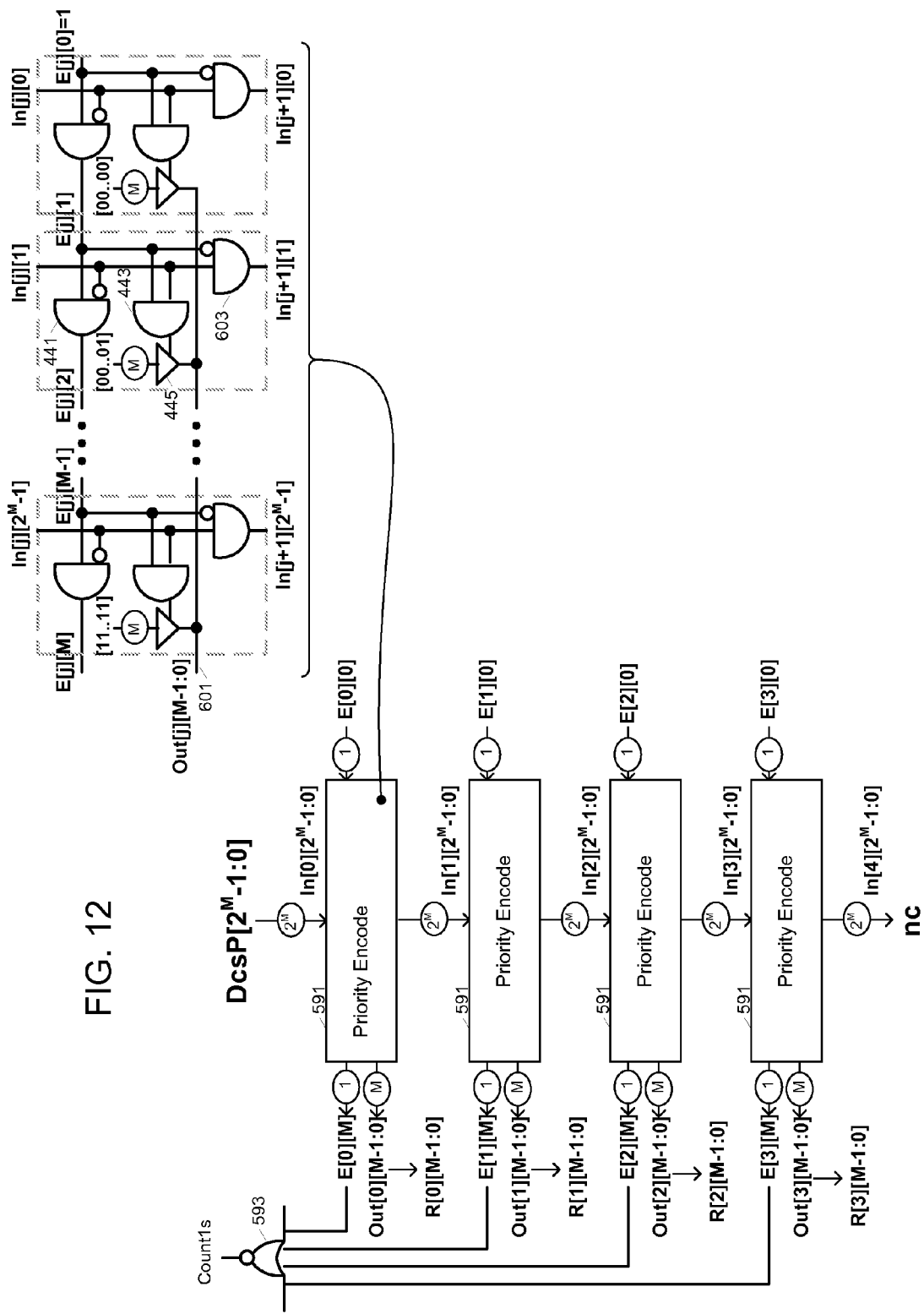
FIG. 12 illustrates an embodiment of a stacked priority-encoder that may be used to implement the priority encoder/population count logic within the memory controller of FIG. 11.

FIG. 12 illustrates an embodiment of a stacked priority encoder that may be used to implement the priority encoder/population verifier logic 543 of FIG. 11. As shown, the stacked priority encoder includes a cascaded set of T component priority encoder circuits 591, each of which receives a decoded (i.e., $2^M$-bit) input and generates (i) a recovered M-bit signature, Out[j][M−1:0], (ii) signature-valid indicator, E[j][M], and (iii) a decoded output that is to be the input to the next component priority encoder circuit in the cascade, In[j+1][$2^M$−1:0].

In the embodiment shown, each component priority encoder is implemented in generally the same manner as the priority encoder shown in FIG. 9. That is, a sequence of AND gates 441 are coupled in a chain, with an inverting input of each AND gate 441 coupled to receive a respective one of input bits In[j] [$2^M$−1:0], and the output of each AND gate 441 (i.e., E[j][i]) being coupled to a non-inverting input of the next AND gate in the chain (the non-inverting input of the first AND gate in the chain being tied high). By this arrangement, the least significant logic '1' bit in the input value will produce a logic low output from the corresponding AND gate 441 and thus render the outputs of the remainder of the AND gates 441 in the chain low. Consequently, the final output of the chain of AND gates 441, which constitutes an active-low signature-valid signal, will be low (indicating valid input) so long as the input value In[j][$2^M$−1:0] included at least one logic '1' bit, and high otherwise. As shown, the signature-valid signal from each component priority encoder 591 is combined in a logic NOR operation within gate 593 to produce the Count1s signal. Accordingly, Count1s will be high (and thus signal that four logic '1' bits were found within the merged signature, DcsP) so long as a low signature-valid signal is generated by each component priority encoder.

The signal provided at the non-inverting input of each AND gate 441 is also supplied to a counterpart AND gate 443 along with the corresponding bit of the input value. The output of each AND gate 443 controls a passgate 445 (or tri-state buffer) which either couples or decouples a respective encoded M-bit value to the component priority encoder output, Out[j][M−1:0], with each encoded value corresponding to a respective bit position within the $2^M$-bit input value. By this arrangement, the least significant logic '1' bit within the input value, In[j] [$2^M$−1:0] will be paired with a logic high AND-gate-chain output so that AND gate 443 will enable the corresponding encoded value to be output via passgate 445 as the component priority-encoder output. The logic low output of the AND gate 441 corresponding to the least-significant logic '1' bit will propagate through downstream AND gates 441 so that encoded values corresponding to more significant input bit positions will not be coupled to the component priority-encoder output, regardless of input bit state.

In addition to AND gates 441 and 443, which function generally as described in reference to FIG. 9, component priority encoder 591 also includes a set of AND gates 603 to generate a next-stage output, In[j+1][$2^M$−1:0], from input In[j][$2^M$−1:0]. More specifically, each AND gate 603 includes a non-inverting input coupled to a respective bit of the component priority-encoder input In[j] [i], and an inverting input coupled in common to the input of chained AND gates 441. By this arrangement, the least significant '1' bit in the input value, In[j] [$2^M$−1:0], will be filtered (i.e., stripped or blocked) from the output value, In[j+1][$2^M$−1:0] due to the logic high signal at the input of chained AND gate 441, while all more significant inputs bits will be passed without change to output In[j+1][$2^M$−1:0] due to the cascading of the logic low output of the AND gate chain corresponding to the least significant '1' within the input value In[j][$2^M$−1:0] to the outputs of all downstream AND gates in the chain (i.e., all AND gates corresponding to more significant bit positions).

Thus, given a merged set of signatures input value, DcsP, as shown in FIG. 11, component priority encoders 591 will yield decoded output values 00000000000000010001000000010 0000, 00000000000000010001000000000 0000, and 00000000000000010000 00000000 0000, with the shaded bit positions showing the positions of logic '1' bits filtered by the component priority encoders. Further, each of the component priority encoders will produce an encoded output, R[j][M−1:0], that matches a respective one of the encoded signature values (EcsM) generated by the memory devices, and will assert a logic '0' code-valid signal to indicate a valid population count.

Continuing at operation 567 of FIG. 11, the mask generation logic 545 generates a mask value, MaskP, from the priority-encoded random values, R[j][M−1:0], and supplies the mask value to driver/receiver 209 via multiplexer 203 (i.e., CSinitP asserted to select MaskP). The driver/receiver 209, in turn, outputs the mask value to each of the memory devices 503 via the data bus. Referring to operation 569, state machine 540 responds to assertion of the Check1s signal (i.e., indicating that the priority encoder/population count logic detected the expected number of logic '1' bits within the merged set of decoded signatures, DcsP) by broadcasting a LdmaskM to the memory devices via the command/address bus. Each of the memory devices, in response, asserts a LDmaskM signal to enable the mask value, MaskP, to be stored within mask register 521 as value, MaskM. As shown at 571, the MaskM value is supplied to mask logic 523 (CS Mask logic) within each of the memory devices and combined therein with the encoded signature, EcsM, to yield a unique N-bit CSmask value for each memory device. Thereafter (at least until power cycle or reset), the CSmask value remains unchanged and is supplied to compare circuit 155 for comparison with the contents of chip-select buffer 177. Thus, as shown at 573, after a unique CSmask value has been generated within each memory device 503, memory controller 501 may issue selective commands (i.e., device-specific commands) by outputting a chip-select value (also referred to herein as "CScmd") corresponding to a desired memory device onto the chip-select lines and a corresponding selective command (e.g., a read or write command directed to the memory device corresponding to the output chip-select value).

FIGS. 13A-13C illustrate an embodiment of mask generation logic 612 that may be used to implement mask generation logic 545 of FIG. 11. As shown, mask generation logic 612 includes multiple column logic circuits 615 that operate on respective columns of the random input values R[j][M−1:0], row logic 617 to perform row operations on the column logic results, and case logic 619 to identify one of a finite possible number of bit patterns indicated by the row logic results and to select final component values that form the MaskP value.

Referring specifically to FIG. 13A, transformation of the input signature values within individual components of the column, row and case logic are shown as a sequence of matrices (R[j][h], Txx[h], S[j][h], U[j][h], V[j1,j2][h], Ux[h], Vax[h]), followed by a final case selection, assignment of rows from the Vax[h] and/or Ux[h] matrices to the final mask value, MaskP assignment, and the set of chip ID values (CsID [j]) that result from combination of the mask value and input signature values. In particular, each of the column logic circuits 615 operates on a respective column of the input matrix, R[j][h], to generate a tally of the number of set (i.e., '1') bits in the column, Txx[h], a simplified version of the input column, and separate outputs of columns having a single set bit (i.e., "unique-bit" columns) and a single pair of set bits ("paired-bit" columns). Referring to the column logic circuit 615 that operates on column 0 of the input matrix, for example (each other column logic circuit may be identically implemented), tally logic 625 determines that column zero of the input matrix has two '1' bits, as indicated by the '1' in row T2 (tally=2), column 0 of the Txx[h] matrix. The tally logic within the other column logic circuits similarly tally the set bits in their respective input columns to yield the tally matrix shown. That is, column 1 has zero set bits (T0=1), column 2 has three set bits (T3=1) and columns 3 and 4 each have a single set bit (T1=1). In one embodiment, simplify logic 627 inverts the data within each input column having one or fewer '0's (in the four-row example shown, inverting any column having three or four '1's), thus yielding the simplified input matrix shown (i.e., column 2 data inverted to its simplified equivalent). Because each of columns 2, 3 and 4 of the simplified input matrix have single set bits (i.e., "unique" bits in a given row), those columns are repeated in the output of the unique-bit logic 631, while the pair of bits in column zero is suppressed. Conversely, the pair of bits in column zero is signaled in the output of the paired-bit logic 629 by a value in the '0,2' row, indicating that the matching bits appear in rows zero and two. None of the other simplified input columns include a pair of bits, as signaled by their zero-valued counterpart columns in the paired-bit matrix.

The outputs of the unique-bit logic 631 and paired-bit logic 629 within each column logic circuit 615 is supplied to respective sets of filter/sum circuits 633 and 635 within row logic 617. Each filter/sum circuit operates on a row of data from the corresponding output matrix (i.e., from the paired-bit matrix or unique-bit matrix), filtering surplus '1' bits from the row (leaving only the least significant '1' bit in the embodiment shown) and generating a count or "row sum" of the number of '1's in the filtered row. Thus, continuing with the example shown, the set of filter-sum circuits 635 that operate on the output of the unique-bit logic 631 yield the Ux[h] matrix shown, stripping the surplus '1' from the Ud column ('a', 'b', 'c', 'd' being aliases for numeric row indices, 0-3), and outputting a row sum (shown as a logical OR operation) of '1' for the Uc and Ud rows (i.e., the non-empty rows), and a sum of '0' for the Ua and Ub rows (i.e., UaM=0, UbM=0, UcM=1, UdM=1). Because none of the paired-bit rows have more than a single '1', the filtered paired-bit output generated by filter/sum circuits 633, Vax[h] matches the paired-bit input, V[j1,j2][h]. As in the filtered-unique-bit output, 'a', 'b', 'c' and 'd' are aliases (replacements) for the numeric row indices, 0-3, so Vab, Vac and Vad are the filtered rows corresponding to unfiltered input rows $V_{0,1}, V_{0,2}$ and $V_{0,3}$, respectively. The paired-bit filter/sum circuits also generate row sums of the '1' bits in the filtered rows, thus yielding VabM=0 (no set bits in row Vab and thus an empty row), VacM=1 (one set bit in row Vac and thus a non-empty row) and VadM=0 (no set bits; empty row).

The filtered unique-bit and paired-bit matrices and the row sums are output to the case logic 619 which determines which of a finite number of possible bit patterns (or cases) are indicated by the row sums and accordingly selects specific rows of the filtered paired-bit and/or filtered unique-bit matrices to populate the final mask value, MaskP, along with a pair of bits, P and Q, that indicate which of the different cases of bit patterns was detected. In the particular embodiment shown (i.e., 4 random input values of 5 bits each), three possible bit patterns are possible:

case 3U: the unique-bit matrix contains three or more non-empty rows, indicating that the unique bit of each non-empty row appears in the corresponding column of only one of the four memory signatures, thus permitting the four signatures to be distinguished on the basis of those three unique-bit columns and assigned a respective chip ID;

(ii) case 2V: the paired-bit matrix contains two or more non-empty rows, indicating that two different pairs of memory devices may be distinguished, thus permitting a first chip ID bit to be assigned '0' and '1' to the two pairs of memory devices distinguished by one column of their respective signatures, and a second chip ID bit to be assigned '0' and '1' to the two different pairs of memory devices distinguished by another column of their respective random values; or (iii) case 1V2U: the paired-bit matrix contains one non-empty row and the unique-bit matrix contains two non-empty rows that are not themselves the same rows in which the matching pair of bits occur, indicating that a first chip ID bit may be assigned '0' and '1' to the two pairs of devices distinguished by one column of their respective random values, and that each of the two pairs assigned the same value for the first chip ID bit may be assigned different values of a second chip ID bit based on the two unique bits (i.e., one for each pair).

In the absence of bit error, one of the above-three cases will apply and may be identified based on the row sums from the row logic. Accordingly, the row sums are supplied to a case select circuit 645 which identifies which of the three cases applies and selects, via multiplexer 653, the outputs of either a 2V row-selector circuit 649, 3U row-selector circuit 651 or 1V2U row-selector circuit 647 to populate row fields within the final mask value, MaskP. Each of the three row-selector circuits 647, 649, 651 includes logic to select/generate a respective sets of rows, X[4:0], Y[4:0] and Z[4:0], from the filtered unique-bit and paired-bit matrices based on the row sums. Each row-selector circuit also sets the case ID bits, P and Q, to a respective one of three different states. In the embodiment shown, the selected/generated rows, X[4:0], Y[4:0] and Z[4:0] constitute bits 4:0, 9:5 and 14:10 within a 17-bit MaskP value, and the P and Q bits constitute bits 15 and 16, respectively.

Still referring to FIG. 13A, the row sums that result from the exemplary filtered paired-bit and unique-bit matrices indicate case 1V2U; two unique-bit rows and one paired-bit row, with each of the unique-bit rows corresponding to a different one of the two matching pairs of rows that yielded the paired-bit row. That is, referring to the simplified input, rows 0 and 2 (i.e., a and c) have matching bits in column 0, so that, because only two bits in that column are set, rows 1 and 3 (i.e., a and d) also have matching bits. Accordingly, to satisfy the 1V:2U case, a non-empty unique-bit row is needed to distinguish between input rows 0 and 2 and thus should occur in either row 0 or 2, and another non-empty unique-bit row is needed to distinguish between input rows 1 and 3 and thus should occur in either row 1 or 3. In this case, Uc[4:0] is non-empty and thus may be used to distinguish between row pair 0,2; and Ud[4:0] is non-empty and thus may be used to distinguish between row pair 1,3. The overall mask bit assignment is shown at 672, with the non-empty paired-bit row forming X[4:0] and thus MaskP[4:0], and the non-empty unique-bit rows Uc[4:0] and Ud[4:0] forming Y[4:0] and Z[4:0], respectively, and thus MaskP[9:5] and MaskP[14:10]. Case ID bits, P and Q are set to 0 and 1, respectively, and the column-select ID bits for the four memory devices, CsID[j][1:0], are determined based on logical dot products of the encoded signature generated by a given memory device, EcsM[4:0], (referenced by its recovered counterpart R[j][4:0]

in FIG. 13A) and the component row values within MaskP (or MaskM). In case 1V2U, for example, CsID[j][1] is assigned the logical dot product of X[4:0] and R[j][4:0] (i.e., X[4]*R[j][4]+X[3]*R[j][3]+X[2]*R[j][2]+X[1]*R[j][1]+X[0]*R[j][0], where '*' denotes a logic AND function, and '+' denotes a logic OR function), and CsID[j][0] is assigned the logical sum (i.e., OR) of Y[4:0]●R[j][4:0] and Y[4:0]●R[j][4:0], where '●' denotes logical dot product. As shown, a unique chip-select ID is produced for each different random value, R[j][4:0]. Accordingly, by executing the logic operations shown within the mask logic of each memory device, a unique chip ID may be generated.

FIG. 13B illustrates operation of the mask generation circuitry shown in FIG. 13A but with a different set of random value inputs, R[j][4:0]. In this case, tally logic 625 generates '1' tallies of two (T2) for columns 0, 1, 2 and 4, and a '1' tally of four (T4) for column 3. Consequently, simplify logic 627 inverts the bits of column 3 (yielding all '0's) and leaves the other four columns unchanged. Because there are three paired-bit columns and no unique-bit columns in the simplified input (S[j][h]), the paired-bit matrix, V[j1,j2][0] includes set bits as shown, and the unique-bit matrix, U[j][h], is empty. Row logic 617 filters the redundant bits from paired-bit rows 0,1 and 0,2 yielding non-empty Vab and Vac rows, as shown, and thus nonzero row sums for VabM and VacM. The filtered unique-bit matrix is empty, so that all unique-bit row sums are zero, as is the row sum for paired-bit row 0,3 (i.e., VadM=0).

Still referring to FIG. 13B, case select circuit 645 identifies case 2V in response to the two nonzero paired-bit row sums (and absence of three nonzero unique-bit row sums), and 2V row selector logic 649 selects the nonzero filtered paired-bit rows to form the X[4:0] and Y[4:0] components of the final mask value (i.e., as shown at 685). As detailed below, the Z[4:0] component of the final mask value is not needed in the 2V case and thus may be left unchanged or assigned a predetermined value (in this case '11111b'). The P and Q bits are set to zero to signal the 2V case, and the CsID[j][1:0] bits are generated as logical dot products of the encoded-memory-signature[j] and MaskP fields X[4:0] and Y[4:0], respectively. As shown, the net result is generation of a unique two-bit ID for each of the four memory devices.

FIG. 13C also illustrates operation of the mask generation circuitry shown in FIG. 13A but with a yet different set of random value inputs, R[j][4:0]. In this case, tally logic 625 generates '1' tallies of three (T3) for columns 0 and 1, tallies of one (T1) for columns 2 and 4, and a tally of four (T4) for column 3. Consequently, simplify logic 627 inverts the bits of columns 0, 1 and 3 (yielding all '0's in column 3, a single '1' in column 0, and a single '1' in column 1) and leaves the other columns unchanged. Because there are three unique-bit columns and no paired-bit columns in the simplified input (S[j][h]), the unique-bit matrix, U[j] [h], includes set bits as shown and the paired-bit matrix, V[j1,j2][0], is empty. Row logic 617 filters the redundant bits from unique-bit row 3 yielding non-empty Ua, Uc and Ud rows, as shown, and thus nonzero row sums UaM, UcM and UdM. The filtered paired-bit matrix is empty, so that all paired-bit row sums are zero, as is the row sum for unique-bit row Ub (i.e., VadM=0).

Still referring to FIG. 13C, case select circuit 645 identifies case 3U in response to the three nonzero unique-bit row sums, and 3U row selector logic 651 selects the nonzero filtered unique-bit rows to form the X[4:0], Y[4:0] and Z[4:0] components of the final mask value (i.e., as shown at 699). The P and Q bits are both set to '1' to signal the 3U case. As shown, CsID[j][1] is generated by summing (exclusive-ORing) the logical dot products of the encoded-memory-signature[j] and MaskP fields X[4:0] and Z[4:0], and CsID[j][0] is generated by summing the logical dot products of the encoded memory signature and MaskP fields X[4:0] and Z[4:0]. Again, the net result is generation of a unique two-bit ID for each of the four memory devices.

FIG. 14 illustrates embodiments of column logic 701 and row logic 711 that may be used to implement the column logic circuits 615 and row logic circuit 617, respectively, within the mask generation circuit 612 of FIGS. 13A-13C. Referring first to column logic 701 (which may be replicated for each of the other four column logic circuits within mask generation circuit 612), tally logic 703 is formed by exclusive-OR gates 715 (indicating tally T3 or T1), AND gates 717, OR gate 719 and AND gate 721 (together with exclusive-OR gates 715, generating tally T3), four-inverted-input AND gate 723 (generating tally T0), four input AND gate 725 generating tally T4), and three-inverting-input AND gate 731 (generating tally T2). Simplify logic 705 may be implemented by a set of exclusive-OR gates 729 that selectively invert the bits of the input column in response to '1' tallies of three or four (i.e., T3 or 4[h], generated by OR gate 727). Unique-bit logic 707 includes a set of AND gates 735 to pass the output of the simplified logic to the unique-bit outputs, U[j][h], if the set-bit tally is three or one (i.e., because all columns having three '1's are converted to columns having a single '1' by simplify logic 705, and thus constitute unique-bit columns). If the '1' tally is not three or one, then the unique-bit output column is empty (no '1's) as the corresponding simplified input column has either two bits or none, and thus is not a unique-bit column.

Paired-bit logic 709 includes three exclusive-NOR gates 733 each to detect a respective one of the three possible pairs of matching bits within the column output by the simplify logic 705. A set of AND gates 737 is provided to selectively pass the match-detection signals (i.e., outputs of gates 733) to the paired-bit output according to whether the tally logic indicates that the simplified column has two set bits. That is, if the simplified input column has fewer than two '1's, then no pair is possible. If the simplified column does have two '1's, then the bit in column zero must match either the bit in column 1, the bit in column 2 or the bit in column 3, with each of those matches being detected by a respective one of the exclusive-NOR gates 733.

Still referring to FIG. 14, the row logic includes a respective filter/sum circuit 741 coupled to receive each row output by unique-bit logic circuits 707 (i.e., rows U[j][4:0], where j=0, 1, 2, 3) and each row output by paired-bit logic circuits 709 (i.e., rows V01[4:0], V02[4:0] and V03[4:0]). In one embodiment, shown in detail view 750, each of the filter/sum circuits 741 includes a chain of OR gates 753 that logically OR the bits of the input row (depicted generally as In[0], In[1], . . . , In[4]) and thus produce a logic '1' row sum (M) if any of the input bits is high. Each of AND gates 751 passes a respective one of the input bits to the corresponding output (i.e., Out0, Out1, . . . , Out 4) only if all less significant input bits are zero (i.e., as indicated by the output of the OR gate chain). Because the output of the OR gate 753 that receives the least significant '1' will go high and drive the outputs of the remainder of the OR gates in the chain high, only the least significant logic '1' in the input row of bits will reach the output row of bits, with all more significant logic '1' input bits being filtered (or stripped, masked, etc.).

FIG. 15 illustrates embodiments of row-selector circuits that may be used to implement the 1V2U, 2V and 3U row-selector circuits within the mask generation circuit of FIGS. 13A-13C. Referring first to 1V2U row-selector 771, the non-empty row output by the paired-bit logic is passed to the 1Vx[4:0] output via multiplexers 781 and 783; a first non-empty unique-bit row having a '1' bit in the paired-bit column is passed to the 1Vy[4:0] output via multiplexers 785, 787, 789 and 791; and a second non-empty unique-bit row having a '0' bit in the paired-bit column is passed to the 1Vz[4:0] output via multiplexers 797, 797, 799, 801 and 803. 1Vp and 1Vq bits are fixed at '0' and '1,' respectively.

In the 2V row-selector 773, the two non-empty paired-bit rows are passed, respectively, to the 2Vx[4:0] and 2Vy[4:0] outputs (i.e., 2Vx[4:0] being selected by multiplexer 815, and 2Vy[4:0] being selected by multiplexers 817 and 819). The 2Vz[4:0] output is unused, but may be set to a predetermined state (e.g., '11.11' as shown). The 2Vp and 1Vq bits are both fixed at '0.'

In the 3U row-selector 775 each of the non-empty unique-bit rows is output as a respective one of 3Ux[4:0], 3Uy[4:0] and 3Uz[4:0] (i.e., by operation of multiplexers 831, 837 and 841 and logic AND gates 835 and 839), and the 3Vp and 3Vq bits are both fixed at '1.'

In the embodiment of FIG. 15, none of the paired-bit rows or paired-bit row sums are applied in 3U row-selector 775, and none of the unique-bit rows or unique-bit row sums are applied in 2V row-selector 773. Accordingly, as in FIG. 11, the 3U row-selector 651 need not receive the filter/sum outputs corresponding to the paired-bit matrix (i.e., from the paired-bit logic 629) and the 2V row-selector 649 need not receive the filter/sum outputs corresponding to the unique-bit matrix (i.e., from the unique-bit logic 631).

FIG. 16 illustrates an embodiment of a case select logic circuit 861 that may be used to implement the case select logic 645 within the mask generation circuit of FIGS. 13A-13C. With regard to the 2V case, the three possible pairs of non-empty paired-bit rows are detected by ANDing the corresponding row sums in respective AND gates 863. The outputs of AND gates 863 are ORed in OR gate 865, so that the 2V case will be signaled (i.e., by assertion of signal 2VM) if any one of the pairs of non-empty paired-bit rows is detected. Similarly, the 3U case is detected by ANDing the row sums corresponding to the four possible trios of non-empty unique-bit rows in respective AND gates 867, and then ORing the results of the AND gate outputs in OR gate 868. Thus, the 3U case is signaled (i.e., by assertion of signal 3UM) if any of the trios of non-empty unique-bit rows is detected.

Still referring to FIG. 16, the 1V2U case is signaled in response to detecting a non-empty paired-bit row in combination with a first non-empty unique bit row having a '1' bit in the paired bit column, and a second non-empty unique-bit row having a '0' in the paired-bit column. Thus, if VabM is asserted (indicating that paired-bit row Vab is non-empty and thus that bits in rows 0 and 1 of the simplified input (S[j][h]) match in at least one column), then case 1V2U will be signaled (i.e., by assertion of 1V2UM) if at least one of rows 0 and 1 has a unique bit, and at least one of rows 2 and 3 has a unique bit. Thus, unique-bit row sums UaM and UbM (corresponding to rows 0 and 1 of the unique-bit matrix) are ORed in gate 871, unique-bit row sums UcM and UdM (corresponding to rows 2 and 3 of the unique-bit matrix) are ORed in gate 872, and the outputs of the OR gates are ANDed with each other and with paired-bit row sum VabM in AND gate 873 to detect a first of three possible 1V2U cases. A second instance of the same logic (i.e., OR gates 871, 872, AND gate 873) is provided to detect a second of the three possible 1V2U cases (i.e., paired-bit column in rows 0 and 2 of simplified input, unique-bit column in at least one of rows 0 and 2, and another unique-bit column in at least one of rows 1 and 3), and a third instance of the logic is provided to detect the third of the three possible 1V2U cases (i.e., paired-bit column in rows 0 and 3 of the simplified input, unique-bit column in at least one of rows 0 and 3, and another unique-bit column in at least one of rows 1 and 2). The outputs of AND gates 873 provided for the three possible 1V2U row-sum patterns are ORed in gate 875, thereby signaling the 1V:2U case (i.e., by asserting signal 1V2UM) if any of the three 1V2U patterns are detected.

If none of the three cases (2V, 3U, 1V2U) is detected by case logic 861, an error may be signaled to control circuitry within the memory controller (e.g., state machine 540 of FIG. 11) which may then take corrective action (e.g., re-starting the entire chip ID determination/assignment operation or, if a threshold number of attempts to determine/assign chip IDs has failed, signaling upstream logic (and eventually the system operator) of the failure. In the embodiment of FIG. 16, the case error is generated by three-input exclusive-NOR gate 877, which raises the error signal if none of the case signals, 2VM, 3UM or 1V2UM, is asserted.

FIG. 17 illustrates an embodiment of a case multiplexer 881 that may be used to implement multiplexer 653 within the mask generation circuit of FIGS. 13A-13C. As shown, if neither of the 3UM or 2VM cases is detected (i.e., 3UM and 2VM signals are both low), the multiplexer pairs 883/885, 887/889, 891/893, 895/897 and 899/901 will output X, Y, Z, P and Q values, respectively, corresponding to case 1V2UM (i.e., 1Vx[4:0], 1Vy[4:0], 1Vz[4:0], 1Vp and 1Vq). If the 2V case is detected (signal 2VM high), the multiplexer pairs will output values corresponding to case 2V (i.e., 2Vx[4:0], 2Vy [4:0], 2Vz[4:0], 2Vp and 2Vq). If the case 3U case is detected, but not case 2V (i.e., 3UM high, 2VM low), the multiplexer pairs will output values corresponding to case 3U (i.e., 3Vx [4:0], 3Vy[4:0], 3Vz[4:0], 3Vp and 3Vq). As shown, the X, Y and Z row values and P and Q bits constitute the MaskP output from the mask generator logic.

FIGS. 18A and 18B illustrate embodiments of a mask circuit and corresponding logical operations that may be used to implement the mask logic circuit 523 within each memory device in the system of FIG. 11 and thus generate a unique chip ID, CSmask[1:0] value in response to the MaskM value generated by the mask generation logic 545. Referring first to FIG. 18B, in case 2V (i.e., P,Q=0,0), CSmask[1] is assigned the logical dot product of X[4:0] and EcsM[4:0], and CSmask [0] is assigned the logical dot product of X[4:0] and EcsM[4: 0], where EcsM[4:0] is the encoded signature generated on a given memory component, and X[4:0] and Y[4:0] are respective non-empty paired-bit rows as described above. In case 1V2U (i.e., P,Q=0,1), CSmask[1] is assigned the logical dot product of X[4:0] and EcsM[4:0], and CSmask[0] is assigned the arithmetic sum (or exclusive-OR) of X[4:0]●EcsM[4:0] and Z[4:0]●EcsM[4:0], where '●' denotes logical dot product, X[4:0] is a non-empty paired-bit input row as described above, and Y[4:0] and Z[4:0] are non-empty unique-bit input rows as described above. In case 3U, (i.e., P,Q=1,1), CSmask [1] is assigned the arithmetic sum of X[4:0]●EcsM[4:0] and Z[4:0]●EcsM[4:0], and CSmask[0] is assigned the arithmetic sum of Y[4:0]●EcsM[4:0] and Z[4:0]●EcsM[4:0], where X[4:0], Y[4:0] and Z[4:0] are non-empty unique-bit input rows as described above.

FIG. 18A illustrates exemplary logic circuitry for carrying out the operations shown in FIG. 18B. Specifically, three logical dot product circuits 915, 917, 919 are provided to produce logical dot products EX, EY and EZ, where EX=X [4:0]●EcsM[4:0], EY=Y[4:0]●EcsM[4:0], and EZ=Z[4:0] ●EcsM[4:0]. In the embodiment shown, each logical dot product circuit is identically constructed and includes AND gates 921 to generate products of the component values of the rows of data being combined and OR gate 923 to generate a logical sum of the component products. CSmask[1] is generated by exclusive-OR gate 927, which arithmetically sums EX and EZ if bit P is set (because AND gate 925 passes EZ to an input of exclusive-OR gate 927 to be arithmetically summed with EX), and outputs EX if bit P is clear. Similarly, CSmask[0] is generated by exclusive-OR gate 931, which arithmetically sums EY and EZ if bit Q is set (because AND gate 929 passes EZ to an input of exclusive-OR gate 931 to be arithmetically summed with EY), and outputs EY if bit Q is clear. By this arrangement, the P and Q bits control whether arithmetic sums of logical dot products are to be produced, and thus select between the logic expressions shown in FIG. 18B according to whether case 2V, 1V2U or 3U has been detected by the case select circuitry.

In the embodiments discussed above, the memory devices have been assumed to be identically manufactured and generally indistinguishable upon power up, with signatures generated thereafter by random value generators. In other embodiments, such memory devices (or other types of integrated circuits) may be manufactured or otherwise pre-configured with non-volatile signatures such as serial numbers, release numbers or the like. Moreover, the pre-configured signatures may be unique or at least likely to be unique in a relatively small population of IC devices, and thus may potentially be used to distinguish the devices for selective-command purposes. In the case where the non-volatile signatures are unknown at system start up, the memory controller may first need to discern the signature values before they may be used for chip selection purposes. This presents particular challenges in the case of symmetrically coupled devices, as none of the memory devices may be individually selectable so as to enable its signature to be read out. In that case, embodiments similar to those shown in FIGS. 3 and 11 may be used to determine the signature for each device, with the non-volatile signature being provided (e.g., in a non-volatile register) in place of or in addition to the random value generators described above.

Another challenge for discerning the value of non-volatile signatures is that the signatures may each include a large number of constituent bits and thus present a vast pattern space. For example, a 32-bit or 64-bit field may be needed to ensure a unique serial number over several millions or even billions of manufactured devices, thus making it impracticable to expand the serial number into a one-hot decoded value (i.e., as with the M-bit random numbers in the embodiments of FIGS. 3 and 11) and therefore leaving the memory controller (or other control IC) to identify one of $2^{32}$ or $2^\Gamma$ possible patterns for each IC.

FIG. 19A illustrates a memory system that addresses the aforementioned challenges of signature identification. As in exemplary embodiments described above, the system having a memory controller 941 and four symmetrically coupled memory devices 943, but in this case each memory device 943 includes a non-volatile register that has been preloaded (or other circuit that has been configured) at manufacturing/production time with a $2^M$-bit signature (e.g. serial number, production number, pseudo-random value, etc.). Also as above, the chip-to-chip connections include a bidirectional data bus (DQ), a command/address bus (CA), chip-select lines (CS) and one or more clock lines (CK). Each of the memory devices 943 includes the above-mentioned non-volatile signature register 951 (or permanently/fusibly configured circuit); command/address buffer 157; command/address decoders 151 and 153; ID-search circuitry including query-ID register 953, query-mask register 955, masked-compare circuit 957, query-result register 959, multiplexer 179 and load-gate 961; chip-select logic including chip-select buffer 177, chip ID register 175 and compare circuit 155; data driver/receiver circuitry 181 coupled to the data bus; and signal receivers 185, 183 and 187 coupled respectively to the command/address bus, chip-select lines and clock line(s). Though not shown, each of the memory devices 943 also includes a core storage array (e.g., one or more banks of storage cells) and access-control circuitry for carrying out data storage and retrieval operations with respect to the storage array, as well as other maintenance operations (e.g., refresh) all as generally described in reference to FIG. 3.

Memory controller 941 includes counterpart signal driver/receivers to those on the memory devices, including data driver/receiver 209 coupled to the data bus and signal driver circuits 213, 211, 215 coupled to the command/address bus, chip-select lines and clock line(s), respectively. Memory controller 941 also includes ID-search circuitry, including state machine 973 (or processor or other control circuitry) to issue commands, control signals and query values associated with chip ID determination; query-result register 971; multiplexers 203, 205 and 207; and chip ID generator formed by state register 231, multiplexer 235 and increment circuit 975. As with memory devices 943, memory controller 941 may include numerous other circuit blocks not shown, including those devoted to memory control operations (e.g., outputting memory read/write/management commands and write data, and receiving memory read data and, if useful, status or maintenance-related information) and other core functions of a processor or ASIC.

As in the embodiments of FIGS. 3 and 11, commands output from memory controller 941 via the command/address bus may be viewed as falling into one of two classes: broadcast commands intended to trigger a responsive operation within all memory devices 943, and selective commands intended to trigger a responsive operation only within a selected one (or subset) of the memory devices. Accordingly, separate command/address decode circuits 153 and 151 are provided within each memory device 943 to decode broadcast and selective commands, respectively. More specifically, selective decode circuit 151 decodes the incoming command (and issues corresponding control signals to carry out the commanded operation) only if a match signal (EQ) from compare logic 155 is asserted, and thus, only if an incoming chip-select value (captured in chip-select buffer 177 after being output by the memory controller in association with the command) matches a chip ID value, CSregM, within chip ID register 175. By contrast, the broadcast decode circuit 153 decodes the incoming command regardless of the chip-select value provided, if any; outputting control signals to carry out the commanded operation if the incoming command code decodes to a valid broadcast command.

Still referring to FIG. 19A, upon initial system power up (and/or reset), the CSregM values within respective memory devices 943 are either unknown or reset to default values and thus may not be reliably used to distinguish the memory devices for purposes of device-specific operations. In the embodiment shown, a recursive search operation is carried out under control of state machine 973 to establish a unique CSregM value for each memory device 943 and thus permit memory controller 941 to select individual memory devices for exclusive access (i.e., by issuing a chip-select value on chip-select lines, CS, that matches the CSregM for the device to be accessed). Starting at operation 981, state machine 973 asserts signal CSinitP to establish initialization paths through multiplexers 203, 205 and 207, and also broadcasts CSinitM to the memory devices 943 to establish an initialization path through multiplexer 179. The state machine also asserts signal LDcsP in a state that passes an initialization value (zero in this example) to the input of state register 231 via multiplexer 235 and thus initializes CSregP to 0. Internally, state machine 973 initializes a query ID value to 0 (00 . . . 00b, where 'b' designates binary) and initializes a recursion index, 'R' to 1. At 983, the state machine outputs a $2^M$-bit query mask value, QmskP, to driver/receiver 209 via multiplexer 203 and thus to memory devices 943 via the data links, DQ. State machine 973 also broadcasts a LDmskM to the memory devices command via multiplexer 273 to enable the query mask to be stored in query-mask register 955 (i.e., as value QmskM). As shown in 983, the query mask may be generated by the state machine (or other logic) by setting the 'R' most significant bits (i.e., bits $2^M-1:2^M-R$) to a non-masking state and all other bits to a masking state. Thus, as 'R' has been initialized to 1, and assuming a logic '1' masking state, '011 . . . 11b' is initially loaded into the query-mask register.

At 985, the state machine outputs the previously initialized query ID, QidP, to memory devices 943 via multiplexer 203 and driver/receiver 209, and also broadcasts a LDidM command to enable the query ID to be stored in query-ID register 953 (i.e., as value QidM). The masked-compare circuit 957 performs a masked, bitwise comparison of the query ID from register 953 and the non-volatile signature (SigM) from register 951, masking any mismatch indications from bit positions corresponding to masking-state bits of the query-mask from register 955. In one embodiment, for example, the masked compare circuit includes logic circuitry to perform the following operation:

$$QresultM = ((SigM[0] \text{ xnor } QidM[0]) + QmskM[0]) \&$$
$$((SigM[0] \text{ xnor } QidM[1]) + QmskM[0]) \&$$
$$\vdots$$
$$\vdots$$
$$((SigM[2^M - 1] \text{ xnor } QidM[2^M - 1]) +$$
$$QmskM[2^M - 1]),$$

where 'xnor' denotes an exclusive NOR operation, '+' designates a logic OR operation, '&' designates a logic AND operation, and QresultM is the masked-compare output, latched in query-result register 959 in response to an edge of clock signal, CK.

Continuing at operation 987 of FIG. 19A, state machine 973 broadcasts an EH/EL command to enable the merged transfer of the query result (i.e., QresultM) on at least one of the DQ links (e.g., DQ[0] in this example). In one embodiment, the merged transfer is effected generally as described in reference to FIGS. 3 and 5A-5C (though only one link need be driven to transfer a hit/miss bit) to effect a wired OR of the query result generated by each memory device. The merged query result is captured within the memory controller's query register 971 (i.e., as QresultP) and indicates whether a 'hit' (i.e., match) was detected within any one of the memory devices between the unmasked bits of the query ID and corresponding bits the non-volatile signature for that memory device. As shown at operation 989, if a hit was detected (e.g., QresultP=1), and the recursion level, R, is less than the deepest level (i.e., R<$2^M$), then a recursion is executed by incrementing the recursion index to R+1 and returning to operation 983 to repeat the ID query (i.e., operations 983, 985, 987) with an additional unmasked bit. Otherwise, if a hit was detected at the maximum recursion index (i.e., R=$2^M$), then a non-volatile identifier has been found, as the query is completely unmasked at the deepest recursion level. Accordingly, as shown at 991, the state machine broadcasts LDcsM to load the previously initialized chip ID (i.e., CSregP, which resides in chip-select buffer 177 by virtue of transfer via multiplexer 205 and chip-select lines, CS), into chip ID register 175 as CSregM. By this operation, the chip ID value is assigned (i.e., gated into the chip ID register) within the memory device that yielded the query hit. Assuming that the non-volatile signature values are known (or at least intended) to be unique within each memory device 943, and absent operational error, the query hit should be signaled by only one memory device 943 so that the chip ID is assigned exclusively to that memory device. In the example shown, the CSregP value had been initialized to zero, so that chip ID '00b' is assigned to establish a unique ID within the query-matching memory device.

Still referring to operation 991, the state machine determines whether the query hit is the last of the expected number of hits, $2^N$ (e.g., by counting the number of query hits or evaluating the CSregP output or other signal indicative of the number of chip ID assignments), concluding the chip ID assignment operation if so. That is, if $2^N$ different chip IDs have been assigned in a system having $2^N$ memory devices, then all memory devices have been assigned a unique chip ID and the identifier search may be terminated at that point. Alternatively, the search may be continued to ensure that no further query hits result and thus to confirm that no error has occurred. Accordingly, after all the other memory devices have received alternate chip ID assignments (i.e., chip ID values other than '11b'), the memory controller may selectively command the memory device assigned the '11b' ID by asserting chip-select value '11b' on the chip-select lines in association with a command/address value conveyed on the CA bus.

If the fully-unmasked query hit at 991 is not the last of the expected number, the state machine concludes operation 991 by issuing LDcsP to load an incremented chip ID (i.e., loading the output of increment logic 975 into state register 231 via multiplexer 235) and, at 993, determines whether '0' and '1' bit states of the least-significant unmasked bit of the query ID (i.e., Qid[$2^M$-R]) have been searched. Because Qid was initialized to 0 in this example, a '0' value of the least-significant unmasked query-ID bit indicates that the '1' state of the bit has not yet been searched. Accordingly, if Qid[$2^M$-R]=0, the state machine inverts the state of that bit (i.e., sets to '1' in this iteration), and repeats the query operation for the new Qid value starting at 983. Otherwise, the query at the current recursion level is complete.

At 995, state machine 973 determines whether the recursion index is greater than the minimum index (i.e., R>1) and, if so, returns to a shallower recursion level by decrementing the recursion index. Because the return from recursion at a given level should only be reached as a result of a recursion hit at a shallower recursion level, at least one state of the least significant unmasked Qid bit at the shallower level must already have been searched, and possibly both have been searched. Accordingly, a return from recursion is effected by decrementing the recursion index to R−1 and then returning to 993 to check the state of the least-significant unmasked Qid bit at the reduced index (i.e., shallower recursion level) and thus determine whether both states of the least-significant unmasked bit at that level (i.e., the "test bit") have been searched. If not (i.e., Qid[$2^M$-R]=0), then the bit inversion shown in 993 is carried out (i.e., toggling the state of the test bit from '0' to '1'), and another query is executed for the new Qid value. If both states of the least-significant unmasked Qid bit (i.e., test bit) at the shallower recursion level have been searched, then the operation at 995 is repeated to return to a yet shallower recursion level.

Still referring to FIG. 19A, if the recursion index is already at a minimum (i.e., r=1 in this example) at the start of operation 995, then the recursion has already returned to the starting level and the search operation is complete. In an embodiment in which the search is terminated upon assigning the expected number of chip IDs (i.e., without completing the recursive search), then reaching operation 995 at the minimum recursion level means that the recursive search has been completed without assigning the expected number of chip IDs. In that case, the system may signal an error or restart the entire search as shown at 997, or take other corrective action. As an example, in an embodiment in which the memory device signatures are not pre-loaded, but rather generated by random number circuitry (e.g., as in FIGS. 3 and 11), randomization failure (i.e., failure to generate unique random values within each memory device) may be inferred from the failure to assign the expected number of chip IDs. In that case, the random number circuitry may be enabled to generate a new set of random values, and the recursive search restarted at [1] 981.

FIG. 19B is a pseudo-code listing of exemplary operations that may be executed to effect the recursive identifier-search operation described in reference to FIG. 19A and which may be applied within a more generalized hardware implementation. Referring to the pseudo-code listing by line number, an overarching function of assigning chip IDs, "AssignChipID," is begun at 100, and includes initializing a chip ID variable to zero at 110, invoking a recursive routine, "QueryMem( )" at 120, and then terminating at 130. As shown, the QueryMem routine includes two arguments: a query ID value (Qid) and a recursion index (R) which are set to 0 and 1, respectively, in the invocation at 120. The query ID and recursion index may be passed by value to permit reentrancy thus recursion of the QueryMem routine.

Referring to the exemplary pseudo-code listing of the QueryMem routine, at 210 a query mask variable, Qmsk is generated by right-shifting a value of $2^M-1$ (i.e., all '1's) by a R bit positions, effectively dividing $2^M-1$ by $2^R$ to generate a mask value in which the R most significant bits are in a non-masking state and all less significant bits are in a masking state. In the case of R=1, for example, Qmsk=011 . . . 11b; for R=2, Qmsk=001 . . . 11b, and so forth to $R=2^M$, which yields Qmsk=00.00b, a fully cleared mask.

At 220, a bitmask variable, Bmsk, is generated by right-shifting a value of $2^M/2$ (i.e., 100 . . . 00b) by R bit positions to obtain a mask having a solitary set bit (i.e., one hot) in the position corresponding to the least significant non-masking bit (i.e., test bit) of the query mask. As discussed below, the bit mask is used to invert the test bit of the query ID after each query operation at a given recursion level.

Still referring to FIG. 19B, at 230, a loop is begun and repeated until the exit condition shown at 350 is met. The loop defined by 230 and 350 is referred to herein as the "query loop" as each iteration effectuates a query for a given query ID and query mask value. More specifically, as shown at 240, the query ID and query mask values are loaded into the memory devices (e.g., by broadcasting as many load commands as necessary to complete the transfer) and at 250 the query result is captured (e.g., by controlling driver/receiver circuits as described above). If the query result indicates a hit (determined at 260), and if the maximum recursion level has not been reached (determined at 270), then the QueryMem routine is recursively invoked at 280, passing the instant recursion index plus one (R+1) and instant query ID value as the parameters to be applied in the recursion. Because the recursion index corresponds to the number of unmasked bits in the query ID, the net effect of the recursive call is to execute the query loop with one additional unmasked bit and thus search the next less significant bit position.

Returning to line 270, if the maximum recursion level has been reached, then the query hit indicates that a pre-loaded (or randomly generated) memory signature has been found. In that case, the "else" path at 290 is followed, loading the chip ID into the hit-yielding memory at 300 to effect a chip ID assignment, and incrementing the chip ID at 310 in preparation for a subsequent chip ID assignment. After returning from a recursion at 280, completing a chip ID assignment/ID-increment at 300/310, or a query "miss" determination (i.e., negative determination at 260), the nested if statement begun at 260 is exited (hence the "endif" statements at 320, 330) and execution proceeds to 340. At 340, the query ID is exclusive-ORed with the one-hot bit mask (generated at 220), thereby inverting the least-significant unmasked bit of the query ID. Because the query ID was initialized to zero, the operation at 340 will toggle the least-significant unmasked bit of the query ID from '0' to '1' in a first iteration of the query loop for a given invocation of the QueryMem routine, and from '1' to '0' in a second iteration of the query loop. Thus, a determination that the test bit (i.e., least-significant unmasked bit) is '0' after execution of the operation at 340 indicates that both states of the bit have been searched for a given invocation of the QueryMem routine and therefore completion of the QueryMem invocation. Conversely, if the test bit is '1' after execution of the operation at 340, only the '0' state of that bit has been tested. Accordingly, if the bitwise AND of the query ID and bit mask (i.e., Qid & Bmask) determined to be zero at 350, the QueryMem invocation is concluded, and execution proceeds following the point of invocation in the invoking routine (i.e., another instance of the QueryMem routine or the overarching AssignChipID routine). Alternatively, if Qid & Bmask yields a non-zero result at 350 and if all chip IDs haven't been assigned (indicated by condition "chipID<$2^N$" in exit criteria 350), a second iteration of the query loop is begun at 230, starting with loading the query mask and updated query ID into the memory at 240. Still referring to exit condition 350, if a QueryMem invocation is exited due to assignment of all chip IDs (i.e., chip ID equal to/greater than $2^N$), all recursive invocations will likewise be exited, concluding the Chip ID assignment operation.

FIG. 19C illustrates an exemplary recursive search in accordance with the approach described in reference to FIGS. 19A and 19B. For brevity, the search example assumes a system with two memory ICs having respective 5-bit signatures of '11001b' and '10010b'. Each query loop iteration is numbered (under heading "Q-Loop#"), and the query ID (Qid), recursion level (R), query mask (Qmask), net queried value (Action) and query result (Qresult) for each loop iteration are as shown. Any change of state effected in the query ID or the recursion level is also shown for each loop iteration under heading "State Change." Though not specifically indicated, the query ID, query mask and net queried value are expressed in binary notation with 'x' in the net queried value indicating a masked bit position.

Starting at query loop 001, an initialized query ID ('00000' in this example) and recursion index (R=1) yield a query mask of '01111' and therefore a query (or search) for value '0xxxx'. Because neither of the memory signatures has a zero in the most significant bit position, a query miss results, which, following the operations shown in FIGS. 19A and 19B, yields a toggled bit in the least significant unmasked bit of the query ID (i.e., bit 4) as shown in the state change column.

In query loop 002, the updated query ID is applied in the same recursion level (and therefore with the same query mask) and thus effects a query for value '1xxxx'. The resulting query hit produces a recursion (e.g., recursive invocation of the query operations) with an incremented recursion index (i.e., R=2) as shown. Consequently, in query loop 003, the same query ID '10000' is applied, but with an additional unmasked bit (due to the incremented recursion index), yielding a query for '10xxx' and thus another hit (matching the first two bits of signature 10010), and another recursion. Similarly, in query loop 004, the same query ID is applied, but with a third unmasked bit, yielding a query for '100xx' and thus yet another hit (matching the first three bits of signature 10010) and recursion. In query loop 005, the same query ID is applied with four unmasked bits (i.e., R=4), effecting a query for '1000x' and thus a miss. Consequently, the recursion index remains unchanged, and the least significant unmasked bit of the query ID (i.e., bit 1, the test bit) is inverted to produce an updated query ID, '10010'. The updated query ID is applied in query loop 006 with the same query mask as in the prior loop iteration (i.e., because the recursion index is unchanged) to effect a query for 1001× and thus a hit (matching the first four bits of signature 10010). The query hit yields a recursion to a final recursion level (R=5) and consequently application of the same query ID with all five bits unmasked (i.e., R–5) and thus a query for '10010' in query loop 007. The resulting hit at the maximum recursion index indicates that a memory signature has been found, and thus triggers assignment of chip ID 0 to the memory device bearing the query-ID-matching signature. At the conclusion of query loop 007, the query ID value is updated by inverting the least-significant unmasked bit (the LSB in this case) to obtain '10011'. Because no recursion or return from recursion occurred in loop 7, the recursion index and query mask remain unchanged from query loop 007 to 008, producing a query for '10011'. As neither of the memory signatures matches the updated query value, a miss occurs and, because both states of the test bit at the recursion index have been queried (i.e., in loops 007 and 008), a return from recursion occurs effecting a reversion to the prior recursion level (i.e., effectively decrementing the recursion index so that R=4 after returning from recursion at the conclusion of loop 008).

The return from recursion results in conclusion of the query loop in which the recursion occurred, in this case query loop 006. Because query loop 006 has already been executed beyond the query itself, no query is executed in the loop conclusion following return from recursion (numbered 006' to denote that a prior loop is being concluded), but the least-significant unmasked bit of the query ID is toggled (i.e., resetting bit 1 to '0'). Also, because both states of the least significant unmasked bit have been searched (as indicated by the '0' state of bit 1), the recursion to level 4 is complete and a return from recursion occurs, establishing a reduced recursion index, R=3. In this case, the return from recursion results in conclusion of query loop 4; again no query, but toggling the least significant unmasked bit of the query ID to obtain '10100. Because the '1' state of the test bit has not been searched, another query loop iteration (i.e., 009) is executed at the current recursion level to query for '101xx'. Following the query miss (i.e., neither signature matches the unmasked bits), the test bit is toggled again (yielding query ID='10000') and a return from recursion occurs, in this case to conclude the loop begun at 003. Although the query for loop 3 was previously executed (so no query occurs at 003'), the loop conclusion effects a toggle of the test bit at the new (reduced) recursion index, yielding a query ID of '11000' as shown. Because the '1' state of the test bit has not been searched, another query loop iteration (i.e., 010) is executed at the current recursion level (i.e., R=2) to query for '11xxx'. The resulting query hit yields a recursion and thus an incremented recursion index (i.e., R=3) as shown. Consequently, in query loop 011, the same query ID '11000' is applied, but with an additional unmasked bit (due to the incremented recursion index), yielding a query for '110xx' and thus another hit (matching the first three bits of signature 11001), and another recursion. Similarly, in query loop 012, the same query ID is applied, but with a fourth unmasked bit, yielding a query for '1100x' and thus yet another hit (matching the first four bits of signature 11001) and recursion. In query loop 013, the same query ID is applied with all bits unmasked (i.e., R=5), effecting a query for '11000' and thus a miss. Consequently, the recursion index remains unchanged, and the test bit (i.e., bit 0 of the query ID) is toggled to produce an updated query ID, '11001'. The updated query ID is applied in query loop 014 with all bits unmasked (i.e., same query mask as prior loop iteration because the recursion index is unchanged) to effect a query for '11001'. The resulting hit at the maximum recursion index indicates that a second memory signature has been found, and thus triggers assignment of chip ID 1 to the memory device that sourced the matching signature. Because both IDs have been found, recursion quickly unwinds from the maximum to minimum levels (exiting the query loop at each level due to the completed ID assignment) and the chip ID assignment is concluded.

Returning briefly to FIG. 19B, in an alternative embodiment the number of memory devices coupled to the memory controller need not be fixed, predetermined or otherwise known by the memory controller prior to system initialization. Instead, if each of the attached memory devices is guaranteed (or at least likely) to have a different signature than the other attached memory devices, then a search of the entire signature space will (or will likely) yield a match between an unmasked query ID and a memory signature for each attached memory device, and thus an indication of the number of attached memory devices. Accordingly, the memory controller may "learn" (or determine or discover) the number of attached memory devices by recursively searching the entire signature space, tallying the number of memory signatures found and then deeming the tally after the entire signature space has been searched to be the number of attached memory devices. Such an embodiment may be effected, for example, by omitting the Boolean expression "chipID<$2^N$" from the loop exit condition in line 350 of FIG. 19B. In such an embodiment, the recursive search will continue even after the last memory signature is found, but still finish in a reasonably efficient time.

Reflecting on the embodiments disclosed above, it should be noted that the various operations initiated/coordinated by the state machine, may also be executed by a programmed processor. For example, an instruction execution engine within memory controller 101 (or 501 or 941) may control the sequence of operations shown during a initialization phase of system operation within the above described embodiments, and then switch over to a run-time control function (or relinquish control to a host processor or other control circuitry) after chip IDs have been assigned to the memory devices (or other type of IC device). The execution engine may be one of multiple processing cores, or may be the primary processing core. Also, it should be noted that the control function may be carried out by control circuitry (including a sequencer, state machine, programmed processor, etc.) external to the system shown. For example, the memory controller (or processor or ASIC) 501, 501, 941 may operate as a control conduit for execution of the operations shown in the various embodiments, issuing control signals and outputting commands in response to commands from an external host (e.g., a host processor executing basic-input-output-service (BIOS) instructions or other program code) and forwarding merged signature values and/or other information received from the memory devices (or other controlled devices) to the external host to enable branching to various operations as described above.

In accordance with the foregoing, the various operations described herein may be effectuated, in whole or part, through execution of machine-executable program code. The program code (i.e., sequences of instructions and related data) may be recorded on one or more computer-readable media for later retrieval and execution within the above described memory controllers (e.g., by one or more processing cores therein), or one or more processors of a special purpose or general purpose computer system or consumer electronic device or appliance. Computer-readable media in which such instructions and data may be embodied include, but are not limited to, machine-readable storage media in various forms. Examples of such machine-readable media include, for example and without limitation, optical, magnetic or semiconductor storage media such as a Flash memory device, floppy disk, CD, DVD, active RAM within a computer, or any other type of physical device from which the instructions may be extracted under full or partial control of a machine.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process (i.e., implementing the circuits in an integrated circuit die or dice).

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Each of the buses may alternatively be a single signal line, and each of the single signal lines may alternatively be buses. Signals and signaling paths shown or described as being single-ended may also be differential, and vice-versa. A signal driving circuit is said to "output" a signal to a signal receiving circuit when the signal driving circuit asserts (or deasserts, if explicitly stated or indicated by context) the signal on a signal line coupled between the signal driving and signal receiving circuits. The expression "timing signal" is used herein to refer to a signal that controls the timing of one or more actions within an integrated circuit device and includes clock signals, strobe signals and the like. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit device for communicating with a plurality of memory devices, the integrated circuit device comprising:
    a data interface to transfer read data and write data in respective memory access operations via a shared data path coupled in common to each memory device of the plurality of memory devices;
    control logic to (i) receive identification information from each memory device of the plurality of memory devices concurrently via the data interface, (ii) generate one or more device-select values based on the identification information, and (iii) output the device-select values to the plurality of memory devices via the data interface, the one or more device-select values enabling unique identification of a respective memory device of the plurality of memory devices; and
    a command interface to output a first command to the plurality of memory devices, the first command instructing each memory device of the plurality of memory devices to output the identification information to the data interface, wherein the first command instructs each memory device of the plurality of memory devices to provide identification information to the data interface, via the shared data path, using a signaling mode in which only a first data state of two possible data states is signaled by each memory device of the plurality of memory devices on respective links of the shared data path.

2. The integrated circuit device of claim 1, wherein the data interface comprises a plurality of signal driver circuits to drive each link of the shared data path to a second data state of the two possible data states so that the respective link of the shared data path on which the first data state is signaled may be distinguished from others of the links of the shared data path.

3. The integrated circuit device of claim 1, wherein the command interface outputs a second command to the plurality of memory devices, the second command instructing each memory device of the plurality of memory devices to compare one of the device-select values with an identifying value sourced by a memory device of the plurality of memory devices.

4. An integrated circuit device for communicating with a plurality of memory devices, the integrated circuit device comprising:
   a data interface to transfer read data and write data in respective memory access operations via a shared data path coupled in common to each memory device of the plurality of memory devices;
   control logic to (i) receive identification information from each memory device of the plurality of memory devices concurrently via the data interface, (ii) generate one or more device-select values based on the identification information, and (iii) output the device-select values to the plurality of memory devices via the data interface, the one or more device-select values enabling unique identification of a respective memory device of the plurality of memory devices; and
   wherein the one or more device-select values comprise a mask value that is output to the plurality of memory devices and which, when combined with an identifying value within a first memory device of the memory devices, produces a chip identification value that is unique with respect to a chip identification value produced by a combination of the mask value and respective identifying values within memory devices of the plurality of memory devices other than the first memory device, wherein the identifying value within each memory device of the plurality of memory devices comprises more bits than the chip identification value produced by the combination of the mask value and the respective identifying value.

5. The integrated circuit device of claim 4, wherein the plurality of memory devices comprises M memory devices, and wherein the chip identification value comprises K bits, wherein K=$\log_2 M$ rounded up to the nearest integer value.

6. The integrated circuit device of claim 1 wherein the command interface is further to output one or more commands to store the device-select values respectively within the memory devices to enable exclusive selection of any one of the memory devices based on a comparison of the device-select value stored within the one of the memory devices and a chip-select value.

7. The integrated circuit device of claim 1, wherein the control logic to output the device-select values comprises logic to output a respective query value to be compared with a respective identifying value within each memory device of the plurality of memory devices and to output a query mask that specifies bits within the query value to be compared with corresponding bits of the identifying value.

8. The integrated circuit device of claim 7, wherein the control logic to receive the identification information from each memory device of the plurality of memory devices comprises logic to receive query-result information indicating whether the bits of the query value specified by the query mask match corresponding bits of a respective identifying value within each memory device.

9. The integrated circuit device of claim 8, wherein the control logic further comprises logic to iteratively revise at least one of the query value and the query mask based upon the query-result information, and to output the query value and query mask to the plurality of memory devices after each revision.

10. The integrated circuit device of claim 9, wherein the logic to iteratively revise at least one of the query value and the query mask comprises logic to increase the number of bits specified by the query mask in response to each query-result information indicating that the identifying value within at least one memory device of the plurality of memory devices matches the query value in the bit positions specified by the query mask, and wherein the control logic further comprises logic to output a chip identification value to the plurality of memory devices in response to query-result information indicating that the identifying value within at least one of the memory devices matches the query value in all bit positions.

11. A method of operation within an integrated circuit device, the method comprising:
   receiving identification information from each memory device of a plurality of memory devices via a shared data path that is coupled in common to each memory device of the plurality of memory devices;
   outputting one or more device-select values to the plurality of memory devices via the shared data path to enable assignment of a unique identifier within each memory device of the plurality of memory devices;
   outputting a first command to the plurality of memory devices, the first command instructing the plurality of memory devices to output identification information via the data interface, wherein the first command further instructs each of the memory devices to output identification information via the shared data path using a signaling mode in which only a first data state of two possible data states is signaled by each memory device of the plurality of memory devices on respective signaling links of the shared data path, the method further comprising driving the signaling links of the shared data path to a second data state of the two possible data states so that the links of the shared data path on which the first data state is signaled may be distinguished from others of the links of the shared data path;
   outputting write data to a selected memory device of the plurality of memory devices via the shared data path in a memory write operation, wherein the selected memory device is selected using the unique identifier; and
   receiving read data from the selected memory device via the shared data path in a memory read operation.

12. The method of claim 11, further comprising outputting a second command to the plurality of memory devices that instructs each memory device of the plurality of memory devices to compare one of the device-select values with an identifying value sourced by the one memory device of the plurality of memory devices.

13. A method of operation within an integrated circuit device, the method comprising:
   receiving identification information from each memory device of a plurality of memory devices via a shared data path that is coupled in common to each memory device of the plurality of memory devices;
   outputting one or more device-select values to the plurality of memory devices via the shared data path to enable assignment of a unique identifier within each memory device of the plurality of memory devices, wherein the one or more device-select values comprise a mask value that is output to each memory device of the plurality of memory devices and which, when combined with an identifying value within each of the memory devices, produces a chip identification value that is unique with respect to the chip identification value produced by combination of the mask value and the identifying value within each other memory device of the plurality of memory devices, wherein the identifying value within each memory device of the plurality of memory devices comprises more bits than the chip identification value produced by the combination of the mask value and identifying value; and outputting write data to a selected memory device of the plurality of memory devices via the shared data path in a memory write operation, wherein the selected memory device is selected using the unique identifier.

14. The method of claim 11, wherein outputting the one or more device-select values comprises outputting a respective query value to be compared with a respective identifying value within each memory device of the plurality of memory devices and a query mask that specifies bits within the query value to be compared with corresponding bits of the identifying value.

15. The method of claim 14, wherein receiving identification information from each memory device of the plurality of memory devices comprises receiving query-result information indicating whether the bits of the query value specified by the query mask match corresponding bits of an identifying value within each respective memory device.

16. The method of claim 15, further comprising iteratively revising at least one of the query value and the query mask based upon the query-result information, and outputting the query value and query mask to the plurality of memory devices after each revision;

increasing the number of bits specified by the query mask in response to each query-result information indicating that the identifying value within at least one memory device of the plurality of memory devices matches the query value in the bit positions specified by the query mask; and outputting a chip identification value to the plurality of memory devices in response to query-result information indicating that the identifying value within at least one of the memory devices matches the query value in all bit positions.

17. The method of claim 15, further comprising generating the identifying value within each memory device of the plurality of memory devices in a random-number-generating circuit within each respective memory device of the plurality of memory devices.

* * * * *